(12) United States Patent
Timans et al.

(10) Patent No.: US 7,317,870 B2
(45) Date of Patent: *Jan. 8, 2008

(54) PULSED PROCESSING SEMICONDUCTOR HEATING METHODS USING COMBINATIONS OF HEATING SOURCES

(75) Inventors: Paul J. Timans, Mountain View, CA (US); Narasimha Acharya, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 147 days.

This patent is subject to a terminal disclaimer.

(21) Appl. No.: 11/137,653

(22) Filed: May 25, 2005

(65) Prior Publication Data
US 2005/0236395 A1    Oct. 27, 2005

Related U.S. Application Data

(62) Division of application No. 10/747,592, filed on Dec. 29, 2003, now Pat. No. 6,951,996, which is a division of application No. 10/209,155, filed on Jul. 30, 2002, now Pat. No. 6,849,831.

(60) Provisional application No. 60/368,863, filed on Mar. 29, 2002.

(51) Int. Cl.
*A21B 2/00* (2006.01)

(52) U.S. Cl. ........................ 392/416; 392/407

(58) Field of Classification Search ............ None
See application file for complete search history.

(56) References Cited

U.S. PATENT DOCUMENTS

| 4,151,008 | A | 4/1979 | Kirkpatrick |
| 4,504,323 | A | 3/1985 | Arai et al. |
| 4,571,486 | A | 2/1986 | Arai et al. |
| 4,615,765 | A | 10/1986 | Levinson et al. |
| 4,649,261 | A | 3/1987 | Sheets |
| 4,698,486 | A | 10/1987 | Sheets |
| 4,865,683 | A | 9/1989 | Burns |
| 5,474,940 | A | 12/1995 | Tsukamoto |
| 5,487,768 | A | 1/1996 | Zytka et al. |

(Continued)

FOREIGN PATENT DOCUMENTS

EP    0 507 667 B1    8/1999

OTHER PUBLICATIONS

Logan et al, Recrystallisation of Amorphous Silicon Films by Rapid Isothemal and Transient Annealing, May 1988, Semiconductor Science and Technology, vol. 3, No. 5, pp. 437-441.

(Continued)

*Primary Examiner*—Thor S. Campbell
(74) *Attorney, Agent, or Firm*—Pritzkau Patent Group LLC

(57) ABSTRACT

Pulsed processing methods and systems for heating objects such as semiconductor substrates feature process control for multi-pulse processing of a single substrate, or single or multi-pulse processing of different substrates having different physical properties. Heat is applied a controllable way to the object during a background heating mode, thereby selectively heating the object to at least generally produce a temperature rise throughout the object during background heating. A first surface of the object is heated in a pulsed heating mode by subjecting it to at least a first pulse of energy. Background heating is controlled in timed relation to the first pulse. A first temperature response of the object to the first energy pulse may be sensed and used to establish at least a second set of pulse parameters for at least a second energy pulse to at least partially produce a target condition.

49 Claims, 13 Drawing Sheets

U.S. PATENT DOCUMENTS

| | | | |
|---|---|---|---|
| 5,612,251 | A | 3/1997 | Lee |
| 5,719,495 | A | 2/1998 | Moslehi |
| 5,841,110 | A | 11/1998 | Nenyei et al. |
| 5,913,974 | A | 6/1999 | Habuka |
| 6,059,873 | A | 5/2000 | Yamaguchi et al. |
| 6,179,465 | B1 | 1/2001 | Yam |
| 6,222,990 | B1 | 4/2001 | Guardado et al. |
| 6,268,270 | B1 | 7/2001 | Scheid et al. |
| 6,376,806 | B2 | 4/2002 | Yoo |
| 6,482,199 | B1 | 11/2002 | Neev |
| 6,570,656 | B1 | 5/2003 | Owens, Jr. et al. |
| 6,656,749 | B1 | 12/2003 | Paton et al. |
| 6,849,831 | B2 * | 2/2005 | Timans et al. ............... 219/390 |
| 2002/0067918 | A1 | 6/2002 | Camm et al. |
| 2002/0102098 | A1 | 8/2002 | Camm et al. |
| 2002/0111043 | A1 | 8/2002 | Mahawili |

OTHER PUBLICATIONS

Cohen et al, Thermally Assisted Flash Annealing of Silicon and Germanium, Oct. 1978, Applied Physics Letters, vol. 33, No. 8, pp. 751-753.

Bomke et al, Annealing of Ion-Implanted Silicon by an Incoherent Light Pulse, Dec. 1978, Applied Physics Letters, vol. 33, No. 11, pp. 955-957.

Lue, Arc Annealing of $BF_2$ Implanted Silicon by a Short Pulse Flash Lamp, Jan. 1980, Applied Physics Letters, vol. 36, No. 1, pp. 73-76.

Kano et al, Rutherford Back-Scattering Study on Xe Flash Lamp Annealing of $^{31}P^+$Ion Implanted Si, Jul. 14, 1984, j. Phys. D: Appl. Phys., vol. 17, pp. 1539-1543.

Klabes et al, Flash Lamp Annealing of Arsenic Implanted Silicon, 1981, vol. 66, pp. 261-266.

Correra et al, Incoherent-Light-Flash Annealing of Phosphorus-Implanted Silicon, Jul. 1, 1980, Applied Physics Letters, vol. 37, No. 1, pp. 55-57.

Altrip et al, High Temperature Millisecond Annealing of Arsenic Implanted Silicon, Jun. 1990, Solid-State Electronics, vol. 33, No. 6, pp. 659-664.

Gebel et al, Flash Lamp Annealing with Millisecond Pulses for Ultra-shallow Boron Profiles in Silicon, 2002, Nuclear Instruments and Methods in Physics Research B 186, pp. 287-291.

* cited by examiner

PULSED PROCESSING SEMICONDUCTOR HEATING METHODS USING COMBINATIONS OF HEATING SOURCES

RELATED APPLICATION

The present application is a divisional application of U.S. application Ser. No. 10/747,592 filed Dec. 29, 2003, now U.S. Pat. No. 6,951,996 which is a divisional of application Ser. No. 10/209,155 filed Jul. 30, 2002 and issued as U.S. Pat. No. 6,849,831 on Feb. 1, 2005, which claims priority from U.S. Provisional Patent Application Ser. No. 60/368,863, filed on Mar. 29, 2002, which is incorporated herein by reference in its entirety.

FIELD OF THE INVENTION

The present invention relates to methods and systems for heat-treating semiconductor wafers with short, high-intensity pulses, in combination with background heating sources, such as, but not limited to, tungsten-halogen lamps or arc lamps.

BACKGROUND OF THE INVENTION

To make electrical devices, such as microprocessors and other computer chips, a semiconductor wafer such as a silicon wafer, is subjected to an ion implantation process that introduces impurity atoms or dopants into a surface region of a device side of the wafer. The ion implantation process damages the crystal lattice structure of the surface region of the wafer, leaving the implanted dopant atoms in interstitial sites where they are electrically inactive. In order to move the dopant atoms into substitutional sites in the lattice to render them electrically active, and to repair the damage to the crystal lattice structure that occurs during ion implantation, the surface region of the device side of the wafer is annealed by heating it to a high temperature.

Three types of semiconductor wafer heating methods are known in the art which are directed to annealing:

Adiabatic—where the energy is provided by a pulse energy source (such as a laser, ion beam, electron beam) for a very short duration of $10 \times 10^{-9}$ to $100 \times 10^{-9}$ seconds. This high intensity, short duration energy melts the surface of the semiconductor to a depth of about one to two microns.

Thermal flux—where energy is provided for $5 \times 10^{-6}$ to $2 \times 10^{-2}$ seconds. Thermal flux heating creates a substantial temperature gradient extending much more than two microns below the surface of the wafer, but does not cause anything approaching uniform heating throughout the thickness of the wafer.

Isothermal—where energy is applied for 1 to 100 seconds so as to cause the temperature of the wafer to be substantially uniform throughout its thickness at any given region. See, e.g., U.S. Pat. No. 4,649,261 at Col. 3, line 65 to Col. 4, line 13.

Unfortunately, high temperatures required to anneal the device side of a semiconductor wafer can produce undesirable effects using existing technologies. For example, dopant atoms diffuse into the silicon wafer at much higher rates at high temperatures, with most of the diffusion occurring at temperatures close to the high annealing temperature required to activate the dopants. With increasing performance demands for semiconductor wafers and decreasing device sizes, it is necessary to produce increasingly shallow and abruptly defined junctions.

Traditional rapid thermal processing (RTP) systems have heated semiconductor wafers in a near-isothermal manner, such that the entire wafer is heated to a high temperature. In rapid thermal annealing processes, a desired goal is to heat the wafer at a very high rate, yet keep the wafer at the desired peak temperature for as short a time as possible. The heating is followed by as rapid a cooling as possible. This allows the required annealing to occur while minimizing undesirable side effects, such as excessive dopant diffusion within the bulk of the wafer. For rapid thermal annealing, heating is generally by activating an array of tungsten-halogen lamps disposed above the device side of the wafer. The heating rate is limited by the thermal mass of the semiconductor wafer. Hence, a very large lamp power must be applied to reach the desired peak heating temperature. This leads to very large power surges during heating ramp-up. In addition, the thermal masses of the lamp filaments limit how fast the radiant heating can be switched off, and thus may prolong the time that the wafer spends at or near the peak temperature. The time constant for typical tungsten-halogen lamps is relatively long, on the order of 0.3 seconds. Hence, the filaments remain hot and continue to irradiate the wafer after the power has been cut off.

The vast majority of dopant diffusion occurs in the highest temperature range of the annealing cycle. Lower annealing temperatures result in significantly less activation of the dopants and therefore higher sheet resistance of the wafer, which exceeds current and/or future acceptable sheet resistance limits for advanced processing devices. Hence, lower annealing temperatures do not solve dopant diffusion problems.

As the state of the art in device production has moved toward devices with progressively decreasing junction depths, there has been an accompanying perception that heat treatment may be enhanced using pulsed heating methods and systems for processing semiconductor wafers. At least one approach in the late 1980's involved a low-temperature background heating stage followed by a pulsed annealing stage. The low-temperature background heating stage typically involved heating the wafer to a mid-range temperature, such as 600° C. for example, with tungsten-halogen lamps, followed by a rapid increase in the temperature to 1100° C. by a pulse from flash lamps for a very short duration, such as 400 µs. The wafer was permitted to cool by radiation. No technique for controlling the repeatability of the process (which simply fires flash lamps at the end of an isothermal anneal) using pulse heating, nor the repeatability from wafer to wafer was provided. Moreover, with regard to process control in terms of repeatability, simple, thermostatic control of background heating was employed. See, e.g., J. R. Logan, et al., "Recrystallisation of amorphous silicon films by rapid isothermal and transient annealing," *Semiconductor Sci. Tech.* 3, 437 (1988); and J. L. Altrip, et al., "High temperature millisecond annealing of arsenic implanted silicon," *Solid-State Electronics* 33, 659 (1990). It is also worthwhile to note that, while both of these references utilize simple, thermostatic control of background heating during pulse exposure, the Logan reference is still further limited in illustrating an implementation of such control wherein the temperature of the substrate undergoing treatment is only indirectly monitored. That is, the substrate being treated is supported by a support substrate. The temperature of the support substrate is monitored, rather than the substrate actually undergoing treatment. Unfortunately, this arrangement potentially further exacerbates problems with regard to thermostatic control by introducing uncertainty as to the temperature of the object which is actually being treated.

U.S. Pat. Nos. 4,649,261 and 4,698,486 disclose, in one alternative embodiment, methods for heating a semiconductor wafer by combining isothermal heating and thermal flux heating (e.g., FIG. 11). The entire wafer is heated to a first intermediate temperature via isothermal heating, such as with continuous wave lamps. Then, the front side of the wafer is heated via thermal flux (pulsed means, such as a high-power pulsed lamp array). The heating methods are carried out while the wafer and heating sources are held within an integrating light pipe or kaleidoscope with reflective inner surfaces that reflect and re-reflect radiant energy toward the wafer. The patents do not describe multi-pulse heating modes, and no techniques are provided to control the repeatability of heating by multiple pulses or from wafer to wafer.

It is submitted that pulse mode heating, as carried out by the prior art, has met with only limited success, despite its perceived advantages, since certain difficulties which accompany its use have not been appropriately addressed, as will be further described below.

U.S. Pat. No. 4,504,323 discusses an annealing method in which a semiconductor wafer is pre-heated to 400° C. in a furnace, then exposed to radiation from an array of flash discharge lamps for a pulse of 800 μsec. The pre-heating temperature is below the desired annealing temperature, and dopant diffusion does not occur. The patent does not disclose multi-pulse heating modes, and no techniques are provided to control the repeatability of heating by multiple pulses or from wafer to wafer.

U.S. Pat. No. 4,615,765 discloses thermal processing using laser or particle beam sources. The patent focuses on methods for selectively delivering power from the laser to specific regions of the semiconductor wafer so as to heat the desired regions without heating other regions. The method is based on tailoring the absorption qualities of two regions to cause different temperature rises from the pulses with pre-determined pulse energy, pulse duration and pulse interval. No techniques are provided to control the repeatability of heating by multiple pulses or from wafer to wafer.

U.S. Pat. No. 5,841,110 provides a more recent approach in the field of RTP. Specifically, a system parameter is adjusted on the sole basis of spectrally integrated reflectivity. Moreover, this reference is somewhat unrelated to the present invention at least for the reason that the reference includes no direct teachings for the use of pulsed sources. While the system is effective and provided significant improvements over the then-existing prior art, it is submitted that the present invention provides still further advantages, as will be seen.

The temperature at a semiconductor wafer surface during pulsed heating can be influenced by several factors, including: (a) background temperature distribution; (b) the pulse energy type, shape and duration; and (c) the optical properties of the wafer. In laser processing, variations in wafer surface reflectivity can cause significant changes in the power coupling on different wafers, or even at different positions on the same wafer. Although lamp radiation has a broader spectrum than laser radiation, variations in optical properties are also known to impact the temperature reached on a wafer surface during rapid thermal processing with tungsten-halogen lamps. Hence variations in coatings can cause variations in reflectivity, altering the absorbed energy on the surface of a wafer or on the surfaces of two wafers intended to have the same surface characteristics.

FIG. 2 is a graph plotting temperature versus time curves of irradiation applied to two semiconductor wafers, each with different surface characteristics. Although the radiation pulses applied to each had the same energy, the more radiation-reflecting wafer reached a lower peak temperature (about 1000° C.) than the more radiation-absorbing wafer (1300° C.). Because identical radiation pulses were applied, a temperature versus time curve 12 for the more reflective wafer is otherwise comparable to a temperature versus time curve 14 for the more absorbing wafer. Thus, on a more reflective wafer, the temperature rise induced by the same pulse or series of pulses from a radiant source is lower than the temperature rise induced on a more absorbing wafer.

In addition to variations in heating temperature caused by different wafer reflectivity, undesired variations can also result from use of multiple pulses of radiation. FIG. 3 is a graph plotting temperature versus time curves for the wafer surface temperature 22 and backside temperature 24, and plotting background heater power versus time 26. With the heating method illustrated in this graph, the background heater is activated to heat the entire wafer (surface and backside) to a first temperature of about 800° C. The heater is then switched to a steady state, and two rapid pulses from a pulse source (such as an arc lamp or laser) are applied to heat the wafer surface to a desired annealing temperature (i.e., 1300° C.). The backside temperature of the wafer remains near the first temperature so as to preclude undesired dopant diffusion. As the heat from the energy pulse diffuses through the bulk of the wafer, the temperature of the wafer backside tends to rise. FIG. 3 shows a 50° C. to 100° C. rise in backside temperature from the first temperature. Following the first pulse, the surface temperature of the wafer drops as heat is conducted into the bulk of the wafer, and the wafer reaches a nearly isothermal condition. The drop in surface temperature is not as rapid as the rise in temperature due to the pulse, such that the wafer surface is still above the first temperature when the second pulse is activated. In this case, the second pulse produces a larger peak temperature (above 1300° C.) than the first pulse, leading to difficulties for process control.

The present invention resolves the foregoing problems and difficulties while providing still further advantages.

SUMMARY OF THE INVENTION

The invention concerns methods and systems for heating an object, such as, for example, a semiconductor wafer or substrate.

In a first aspect, the method comprises: (a) heating the substrate to a first temperature with a first heating source; (b) deactivating or shutting off the power to the first heating source just before or just when applying the first pulse of energy from a pulsed energy source to heat the device side surface of the substrate; and (c) rapidly heating the first surface or device side of the substrate to a second temperature greater than the first temperature by a first pulse of energy from a second heating source, where the second temperature may be, for example, an annealing temperature for a dopant-implanted semiconductor wafer. Optionally, the rapidly heating step (c) may precede the deactivating step (b). In addition, the heating method may include the further step (d) reactivating or again turning on the power for the first heating source after the first pulse from the second heating source has been applied. Moreover, it is also possible for the heating step (a) and the rapidly heating step (c) to be accomplished with a single heating source.

By deactivating the first heating source and heating the bulk of the substrate to the first temperature before or just when the pulse is applied from the pulse source, the bulk of the wafer will remain at or near the first temperature and primarily only the first surface of the substrate will be heated rapidly to the second much higher temperature. As the heat from an energy pulse diffuses through the bulk of the substrate, the average temperature of the substrate tends to rise. If the power to the first heating source remained activated, the backside surface of the substrate could increase in temperature above the first temperature, as would the bulk of the substrate. This creep up in substrate temperature often leads to undesired dopant diffusion, and could cause subsequent applied pulses of equivalent energy to heat the front surface of the substrate to higher than desired elevated temperatures, or other unintended effects. The closed-loop feedback control of the first heating source helps maintain the bulk of the substrate at or near the first temperature, and well below the second treating or annealing temperature.

For annealing a silicon semiconductor wafer, the first temperature preferably is up to 1000° C., or in the range of 200° C. to 1100° C., most preferably in the range of 600° C. to 1000° C. The second temperature (or treating or annealing temperature) preferably is in the range of 600° C. to 1400° C., most preferably from 1050° C. to 1400° C. Heating to the first temperature preferably is carried out at a rate of at least 100° C. per second. Preferably, heating sources, such as tungsten-halogen lamps, arc lamps or arrays of such lamps are used to heat the substrate to the first temperature. In the preferred embodiment, these heating sources are positioned near the backside of the substrate. Alternatively, a heated plate or susceptor might be used to heat the substrate to the first temperature.

The pulsed heating preferably comprises irradiating the first surface of the substrate with radiation produced by an arc lamp, a flash lamp or a laser, such as an excimer laser. In the preferred embodiment, one or an array of pulsed heating sources are positioned near the front side or device side of the substrate.

In a further embodiment, a heating method comprises (a) heating a substrate, such as a semiconductor wafer, to a first temperature with a first heating source; (b) applying a pulse of energy with a second heating source just as the surface of the substrate reaches the first temperature to rapidly heat the surface of the substrate to a desired treating temperature; and (c) deactivating the first and second heat sources. The method optionally may include a series of energy pulses emitted by the pulsed heating source, with the first energy pulse activated just as the surface of the substrate reaches the first temperature.

In yet a further embodiment, a single heat source is used both for heating the substrate to the first temperature, as well as for pulse heating. In such a case, the heating method comprises (a) heating the substrate, such as a semiconductor wafer, to the first temperature with the heat source, (b) applying an additional pulse of energy with the same heat source just as the surface of the substrate reaches the first temperature to rapidly heat the surface to a desired treating temperature, and (c) deactivating the heat source.

In another embodiment, pulsed heating is carried out with a series of pulses emitted by the pulsed heating source. Control is applied to deactivate the first heating source before applying the pulse of energy from the second heating source. The temperature of the backside surface of the substrate is measured via an optical sensor or a pyrometer or a series of optical sensors and/or pyrometers. Using control of the first heating source, the temperature of the backside is maintained at or close to the first temperature below the treating or annealing temperature.

When a series of pulses is used, the first pulse for a flash lamp or arc lamp has a duration of from 10 microseconds to 50 milliseconds, and the second pulse has a duration 10 microseconds to 50 milliseconds, wherein the first and second pulses are applied in series with a gap of from 1 millisecond to 100 seconds between each pulse. When a series of pulses from a laser is used, the first pulse has a duration of from 1 nanosecond to 10 milliseconds, wherein the first and second pulses are applied in series, with a gap of from 1 microsecond to 100 seconds between each pulse. Any number of pulses may be applied, depending upon the processing results desired. The pulsed heating source preferably emits pulses with energy density in the range of 1 $nJ/cm^2$ to 100 $J/cm^2$ at the wafer surface.

In another embodiment, pulsed heating is carried out with a series of pulses emitted by the pulsed heating source. Closed loop feedback control is applied to adjust the pulse parameters for each pulse applied to heat the front or device side of the substrate so as not to apply an energy pulse that will heat the front side of the substrate to a temperature above the desired treating or annealing temperature or, in other words to just reach the desired temperature. Hence, process control is by adjusting pulse parameters (energy, duration, time between pulses), rather than deactivating and reactivating the power to the heating source for the backside of the substrate. The temperature of the front side of the substrate is measured by an optical sensor or a pyrometer or a series of optical sensors and/or pyrometers.

In yet another embodiment, a semiconductor substrate is heated with pulsed energy, and the parameters for the pulse are first determined by estimating the absorptivity of the substrate after a first test pulse (or pre-pulse) of energy is applied. In this method, the substrate is heated to a first temperature below the desired treating or annealing temperature. Then, a first pulse (test pulse or pre-pulse) of energy is applied to heat the substrate to a second temperature greater than the first temperature. Preferably, this second temperature is also below the desired treating temperature, although it is possible to execute the calibration from data obtained after a first treating pulse of energy rather than from a lesser test pulse. During the test pulse, pulse energy data is collected by one or more optical sensors; alternatively or in combination, substrate radiation can also be sensed by one or more pyrometers. The substrate absorptivity is estimated from the sensed data in one of several ways. In one method, one optical sensor detects pulse energy reflected from the substrate, and a second sensor detects pulse energy transmitted through the substrate. The substrate absorptivity is estimated from these two measurements. In a second method, a pyrometer senses the emitted radiation from the front surface of the substrate, providing a means of tracking the front surface temperature. In this case, the temperature rise of the front surface during the test pulse is used to determine the substrate absorptivity. In a third method, a pyrometer senses emitted radiation from the front or the back side of the substrate. Following the application of a test pulse, the substrate temperature equilibrates through the thickness. This bulk temperature rise resulting from the application of the test pulse is measured by the pyrometer viewing the front or the back surface, and this measurement is used to determine the substrate absorptivity. From the estimated absorptivity determined by one of these methods, pulse parameters (energy, duration, time between pulses) for a subsequent energy pulse are determined, and the next pulse is applied to heat the front side or first surface to a desired treating or annealing temperature. Preferably, if a test pulse is used, the test pulse is emitted with energy density in the range of 1 nJ/cm$^2$ to 10 J/cm$^2$ (these are the energy densities at the substrate) and for a duration of from 1 nanosecond to 50 milliseconds. By adjusting the pulse parameters based on in-situ absorptivity estimation, this approach makes it possible to process semiconductor substrates with identical temperature-time profiles regardless of the optical (indeed, physical) properties of the substrates.

With this alternate embodiment, the substrate may first be heated to an intermediate temperature or first temperature below the desired treating temperature. Like other embodiments, the heat sources to heat the substrate to the first temperature preferably include a tungsten-halogen lamp, an arc lamp or an array of such lamps. Alternative heat sources include heated plates or susceptors. Moreover, the backside surface of the substrate may be maintained at or near the first temperature while the pulses of energy from the first heating source are applied to heat the front side or first surface. The backside temperature may be maintained by closed loop feedback control of the heating source(s), such as by controlling the power to the heating sources (deactivating the heating source(s)) when the pulsed heating source(s) are activated.

A system for heating a semiconductor substrate according to the invention comprises (a) a first heating source to heat the substrate to a first temperature, which may be a tungsten-halogen lamp, an arc lamp or an array of such lamps; (b) a pulsed heating source to apply a first pulse of energy to a first surface of the substrate to heat the first surface to a second temperature greater than the first temperature; (c) optionally, a filter associated with the pulsed heating source to screen out selected wavelength radiation emitted by the pulsed heating source; (d) a sensor for sampling radiation reflected by the substrate after the first pulse of energy is applied; and (e) means for adjusting pulse parameters for additional energy pulses applied by the pulsed heating source.

Preferably, the pulsed heating source is an arc lamp or a flash lamp or an array of such lamps, or a laser. Preferably, the filter is a water cooled window or a high-OH quartz window isolating the substrate from the pulsed heating source. Most preferably, where the pulsed heating source is an arc lamp or a flash lamp or an array of such lamps, the filter comprises one or more envelopes that individually surround each lamp bulb. Preferably, the sensor is an optical sensor. Most preferably, additional optical sensors for sampling incident pulse radiation emitted by the pulsed heating source, and pulse radiation transmitted by the substrate or transmitted through the substrate are provided. Preferably, pyrometers are provided to measure radiant energy (a) emitted by the first surface of the substrate to monitor temperature of the first surface of the substrate, and (b) emitted by a backside surface of the substrate to monitor the temperature of the backside surface.

In a continuing aspect of the present invention, an object is processed having opposing major surfaces including first and second surfaces. A system applies heat in a controllable way to the object during a background heating mode using a heating arrangement, thereby selectively heating the object to at least generally produce a temperature rise throughout the object. The first surface of the object is then heated using the heating arrangement in a pulsed heating mode, cooperating with the background heating mode, by subjecting the first surface to at least a first pulse of energy having a pulse duration. The background heating mode is advantageously controlled in timed relation to the first pulse.

In still another aspect of the present invention, an object, having opposing major surfaces including first and second opposing surfaces, is processed using a treatment system by applying heat in a controllable way to the object during a background heating mode using a heating arrangement thereby selectively heating the object to at least generally produce a first temperature throughout the object. The first surface of the object is then heated using the heating arrangement in a pulsed heating mode by subjecting the first surface to at least a first pulse of energy to heat the first surface of the object to a second temperature that is greater than the first temperature. The first surface is permitted to cool during a cooling interval following application of the first pulse thereby allowing the first surface of the object to drop below the second temperature and to thermally equalize at least to a limited extent. After the cooling interval, a second pulse of energy is applied to the first surface of the object to reheat the first surface. During the pulse heating mode, including at least the first pulse, the cooling interval and the second pulse, the second surface of the object is maintained at approximately the first temperature. In one feature, the second surface of the object is maintained at the first temperature by controlling the background heating mode in timed relation to application of at least one of the first pulse and the second pulse.

In a further aspect of the present invention, an object is processed in a system using pulsed energy in a series of pulses, each of which pulses is characterized by a set of pulse parameters. The object includes first and second opposing, major surfaces. The first surface is exposed to a first energy pulse having a first set of pulse parameters to produce a first temperature response of the object. The first temperature response of the object is sensed. Using the first temperature response in combination with the first set of pulse parameters, at least a second set of pulse parameters is established for the application of at least a second energy pulse. The first surface is then exposed at least to the second energy pulse to at least partially produce a target condition of the substrate.

In another aspect of the present invention, a semiconductor substrate, having first and second opposing, major surfaces, is processed in a system by inducing a temperature rise in the semiconductor substrate by exposing the substrate to an energy pulse characterized by a set of pulse parameters. The temperature rise of the semiconductor substrate is sensed using a sensing arrangement. Based on the temperature rise, in combination with the set of pulse parameters, an absorptivity of the semiconductor substrate is determined. In one feature, the absorptivity, as determined, is used as a value in establishing a set of treatment parameters for continuing treatment of the semiconductor substrate. For example, the absorptivity may be used to establish a set of treatment parameters for at least one additional energy pulse. In another feature, the energy pulse is configured in a way which produces a negligible change in the semiconductor substrate with respect to a target condition such that the energy pulse is applied for a measurement purpose. In still another feature, the energy pulse is applied to at least partially transform the semiconductor substrate to the target condition.

In a further aspect of the present invention, an object is processed using heat in a system. Accordingly, a heating source heats the object to a first temperature in a first operating mode thereby performing background heating. The heating source is further configured for applying at least a first pulse of energy to a first surface of the object in a second, pulsed heat operating mode to heat the first surface to a second temperature that is greater than the first temperature. The object produces a radiant energy responsive to the heating source. A sensor is used for producing a measurement by sampling the radiant energy from the object. Pulse parameters for at least one additional energy pulse are adjusted based, at least in part on the measurement. In one configuration, the heating source includes separate background and pulsed heating sections. In another configuration, the heating source is a multimode source such as, for example, an arc lamp, configured for operating in a background heating mode, as the first operating mode, and operating in a pulsed heating mode, as the second operating mode.

DETAILED DESCRIPTION OF THE INVENTION

Apparatus

Figure 1:
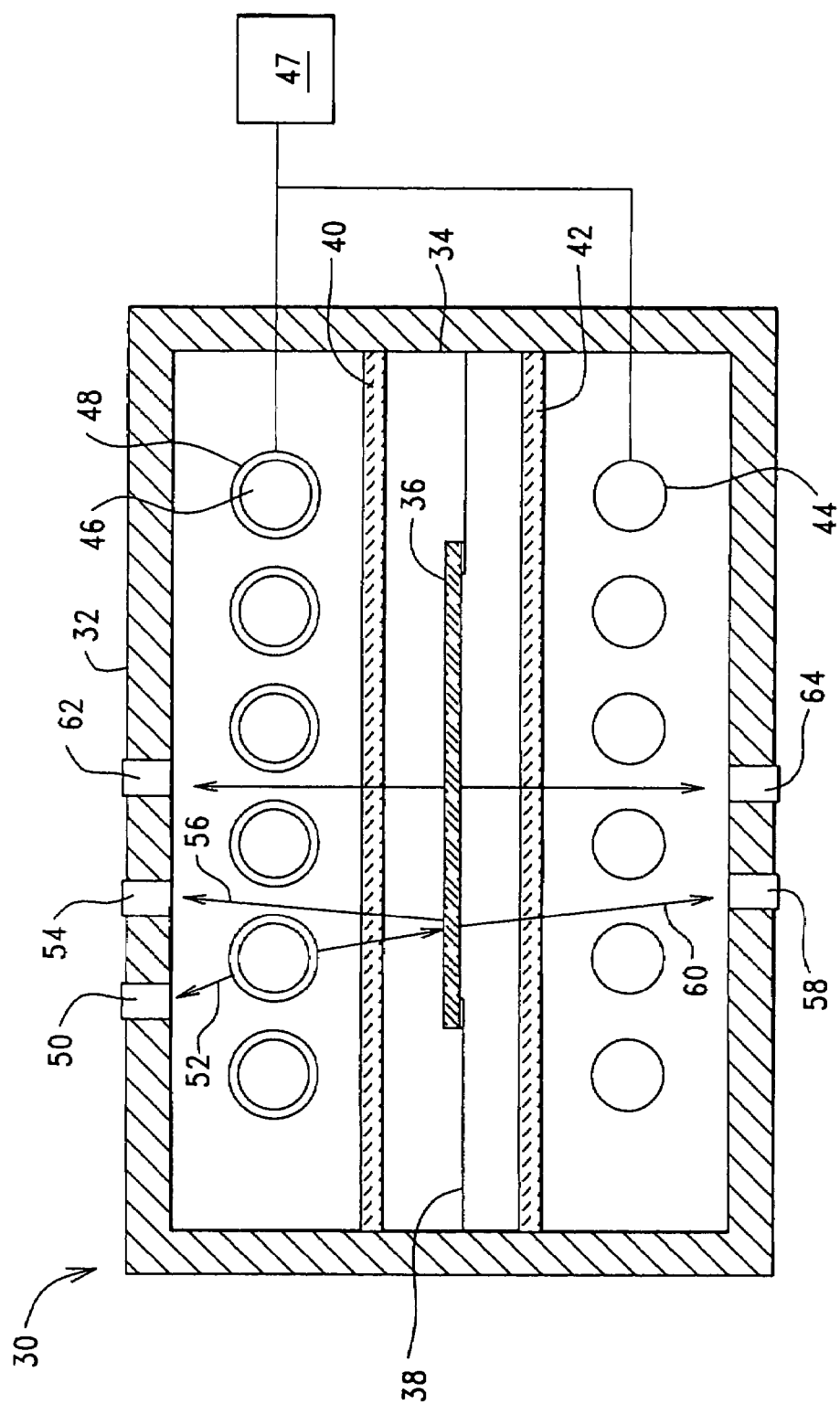
FIG. 1 is a schematic diagram of a pulsed processing system for heating semiconductor wafers according to one aspect of the invention.
Figure 2:
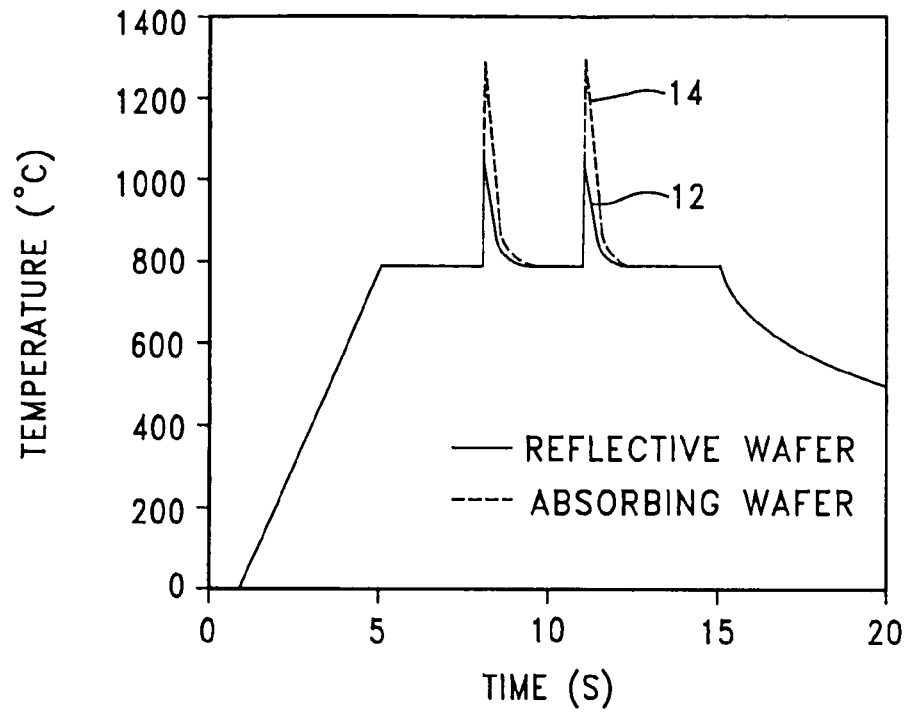
FIG. 2 is a graph plotting temperature in ° C. versus time in seconds for prior art heating profiles for multi-pulse heating of two wafers, where the pulses have the same energy, but each wafer has different reflectivity.
Figure 3:
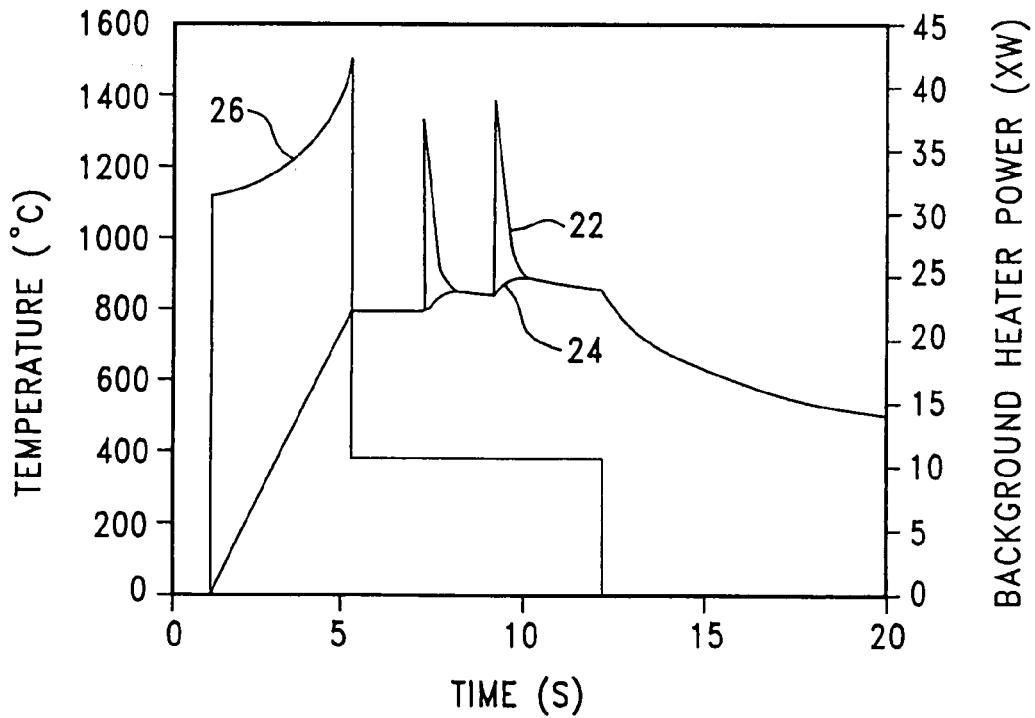
FIG. 3 is a graph (i) plotting temperature in ° C. versus time in seconds for prior art heating profiles for the surface and back side of a wafer heated with a background heater and with its surface heated by radiation from multiple pulses from a pulse heating source; and (ii) plotting background heater power in kW versus time in seconds for the background heater.

Referring first to FIG. 1, a pulsed processing system 30 includes a housing 32 defining a processing chamber 34 inside which is disposed a substrate 36, such as a semiconductor wafer, held upon a support 38. Quartz windows 40, 42 isolate the substrate 36 and support 38 from heating sources 44, 46 disposed within the housing 32, and are located both above and below the substrate 36. Heat sources 44 and 46 are controlled by a computer/control arrangement 47 which is configured for selectively applying an electrical power level to each of background heating sources 44 and pulsed heating sources 46 to accomplish precise control of both sources. It is noted that control arrangement 47 is readily adaptable for controlling a multimode source in view of this overall disclosure, so as to deliver a heating profile from a single source which combines background heating behavior as well as pulse delivery. Quartz windows 40, 42 may also be water-cooled by providing one or more channels (not shown) for water to flow along at least one of the surfaces of the windows. The housing walls 32 of the processing chamber 34 preferably have reflective interior surfaces.

The surface of the substrate 36 in part contacting the support 38 is frequently called the backside surface, and the opposite surface of the substrate is frequently called the front side or device side, in the case of a semiconductor wafer. In the context of this disclosure and in the claims the front side surface may be referred to as a first surface while the backside surface may be referred to as a second surface. Moreover, it is important to understand that the present invention contemplates pulse heating of either or both of the major surfaces of an object, such as a substrate, that is undergoing treatment.

Tungsten-halogen lamps 44 are disposed in a parallel array below the backside of the substrate. The lamps are powered and may be controlled via computer control, as shown. The lamps 44 are capable of ramping up the temperature of the substrate 36 at a rate of at least about 20° C. per second, preferably 200° C. to 300° C. per second. This rate may be considered as a maximum instantaneous ramp rate. In other words, the slope or derivative of the heating profile, plotted against time, exhibits a value of at least 20° C. per second for at least one point in time responsive to background heating. The lamps may be air cooled (not shown). For instance, lamp model J208V-2000WB1 from Ushio America, Inc. is a 2 kW tungsten-halogen lamp that may be used for the background heating, and disposed facing the backside of the substrate. It is to be understood that any suitable form of lamp or heating device may be used as a functional equivalent of tungsten-halogen lamps 44 and that there is no limit as to either the physical arrangement or number of heating devices which may be employed. As an example, background heating may be performed using hot plates and/or susceptors.

Arc lamps 46 are provided in a parallel array above the front side or device side of the substrate 36. Lamps 46 are capable of generating energy pulses to heat the front side of the substrate 36 very rapidly, such as at rates greater than 1000° C. per second. Lamps 46 may be activated singly or in groups to create the desired pulse heating profile on the front surface of the substrate. The lamps may be air or water cooled (not shown). Arc/Flash lamps are made in different sizes and are available with radiant power emission ranging from few watts to several kilowatts. For example, lamp model 10F10 from PerkinElmer Optoelectronics can handle up to 13 kJ of energy and can be powered up to 16 kW of mean power.

Lamps 46 are enclosed by filters 48 to selectively filter a pyrometer-wavelength radiation (yet to be described) from the energy emitted by the lamps 46. Alternatively, a water jacket (not shown) may be placed over the quartz envelopes of the lamps to selectively filter the pyrometer wavelength.

It is to be understood that the present invention contemplates the use of any suitable form of energy which can be applied in a pulsed mode. As an example, the use of a pulsed electron beam is contemplated.

A first sensor 50 is associated with the housing 32 above the lamps 46 to monitor radiation (represented by arrow 52) incident from the arc lamps 46. A second sensor 54 is associated with the housing 32 above the lamps 46 to monitor radiation (represented by arrow 56) reflected from the substrate 36. A third sensor 58 is associated with the housing 32 below the lamps 44 to monitor radiation (represented by arrow 60) transmitted by the substrate 36.

Pyrometers 62, 64 associated with the housing 32 both above lamps 46 and below lamps 44 are used to measure the front side and backside temperatures of the substrate, respectively. For example, the wafer backside can be monitored by a Ripple pyrometer from Luxtron, and the wafer frontside (which is illuminated by flashlamps) may be monitored by a pyrometer with a fast response sensor, such as the Indium Arsenide sensor, model number J12TE4-3CN-RO2M from EG&G Judson. The lamp intensity may be monitored for closed loop purposes with a sensor, such as an Indium Gallium Arsenide sensor model number PDA400 from Thor Labs.

Pulsed Heating Methods

For repeatable semiconductor wafer heat-treating processes with multiple heating sources, the combined background and front side heating should be applied with similar thermal cycles at all points on all wafers processed, regardless of variations in wafer type. Variations in the reflectivity of the wafer surface can cause significant changes in the power coupling on different wafers or even on different positions on the same wafer. Variations in optical properties can impact the temperatures reached on the wafers during rapid thermal processing. Control of the background heating throughout the heating cycle is desirable for multi-pulse heating methods to prevent excessive heating of the front or device side of the wafer or the backside of the wafer.

Figure 4:
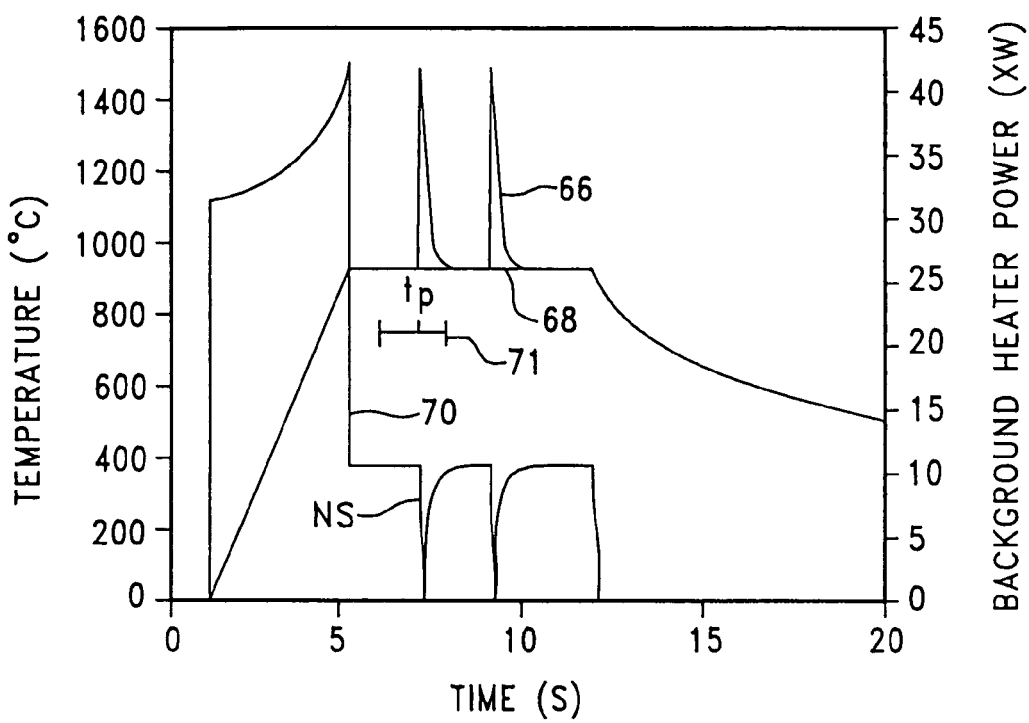
FIG. 4 is a graph illustrating a heating method according to a first embodiment of the invention—(i) plotting temperature in ° C. versus time in seconds for heating profiles for the surface and back side of a wafer heated with a background heater and with its surface heated by radiation from multiple pulses from a pulse heating source; and (ii) plotting background heater power in kW versus time in seconds for the background heater.

Referring to FIG. 4 in conjunction with FIG. 1, a recipe for one exemplary multi-pulse heating method according to the invention is illustrated graphically and is implemented using pulsed processing system 30. It is noted that the various diagrammatic heating and power plots which are illustrated are not intended as being limiting in any sense, are not drawn to scale as to any axis and have been presented in a way which is thought to enhance the reader's understanding of the present invention. The temperature of the front side of the substrate is shown by curve 66. The temperature of the backside of the substrate is shown by curve 68. Curve 68 tracks curve 66 except during the applied pulses from pulse heating source(s), where curve 68 remains at or near the first temperature below the desired treating or annealing temperature. Specific design considerations in the actual implementation of heating in accordance with this exemplary method are taken up below.

In performing the heating recipe of FIG. 4, first, background heating source 44 of FIG. 1 heats the substrate at a rate of about 200° C. per second. The power to the lamp arrangement is shown by curve 70. After ramping up the power, and ramping up the temperature, the power is then reduced to a steady state in order to maintain the substrate at the first temperature of 800° C., which is below the desired maximum treating temperature.

A first pulse from pulsed heating source 46 is applied to heat the front surface of the substrate to the maximum or desired treating or annealing temperature of approximately 1300° C. as shown in FIG. 4. Background lamps 44 are controlled in timed relation to the application of the pulse. This pulse may be applied within a time interval 71 measured, for example, from initiation at time $t_p$ of the pulse. In the present example, just before or as the pulsed heating source is activated, the power to the first heating source is deactivated or shut off. The backside temperature remains at or near 800° C. during the pulse, even as radiant energy from the pulse is diffused through the substrate. This constant or nearly constant temperature is obtained despite the lag in the cooling of the front side of the substrate following the pulse. The power to the first or background heating source is switched back on just after the pulse to help to maintain the backside temperature at the desired constant 800° C. Again, power is re-applied in a controlled way to the background heating source 44 in timed relation to the pulse. In one modification, background heating may be terminated by a negative going step indicated as "NS" such that pulse heating is performed in timed relation to the interval end of a steady state background heating interval.

If a second pulse or a series of additional pulses are applied to treat the front side of the substrate, the process of feedback control for the first heating source is repeated. As shown in FIG. 4, the power to the first heating source is again reduced or deactivated just before or right at the start of the second pulse. Again, the background heating may be controlled within interval 71 (shown for the first pulse) measured, for example, from initiation of the second pulse, as is true for any additional pulses that are applied as part of the pulsed heating mode. The second pulse heats the front side of the substrate to the desired 1300° C. treating temperature, but the backside temperature remains at or near the lower initial temperature (800° C. in this example).

It should be appreciated that control of background heating, using the timed relation concept of the present invention, is highly advantageous over mere thermostatic control as is seen in the prior art, particularly in the context of pulsed mode heating. By definition, pulse mode heat is delivered at very high rates occurring during a very short increment in time. The present invention recognizes that thermostatic temperature control is generally ineffective under such circumstances. That is, where pulse heating is used, thermostatic heating exhibits a marked tendency to respond "after-the-fact." For example, the input of pulse mode energy at one major surface of a substrate can produce a rapid and significant increase in the temperature of an opposing major surface. Such a temperature increase cannot be prevented where the temperature of the opposing surface is monitored and used to control background heating since the response at the opposing surface lags the pulse. The temperature can continue rising despite reduced power to the background heating. In this regard, it is emphasized that the temperature response or increase at the opposing surface takes place after the pulse which produces the temperature increase. Where process parameters, particularly maximum temperature limits, cannot be exceeded, for example, without causing device degradation or destruction, it should now be apparent that thermostatic control is particularly problematic using pulsed mode heating.

In contrast, timed relational control of background heating, as taught herein, serves to resolve this difficulty, since control is available in anticipation of a pulse. Of course, it should be recognized that implementation of such a highly advantageous system and method is neither trivial nor obvious.

In some situations, applying an earlier pulse to preheat a substrate so that subsequent pulses heat the front surface of the substrate to higher temperatures than an intermediate temperature may be desired. Feedback control may then be used selectively to control power to the first heating sources, for example, only when the processing recipe calls for maintaining the backside of the substrate at or very near a constant temperature.

In other situations, the spike heating from the pulse of applied energy may be too large, and cannot be compensated solely by control of power to the first heating source during the actual pulse interval. In such situations, the pulse parameters (energy, duration of pulse, time between pulses) may be adjusted for subsequent pulses in concert with background heating. Alternatively, the background heating power may be adjusted in timed relation to the application of the pulsed energy in anticipation of thermal effects produced by the pulse. Independently or at the same time, pulse parameters may be adjusted to achieve target treatment temperatures. In one implementation, pulse parameters of a second pulse and subsequent pulses may be adjusted such that the first surface reaches its target temperature, $T_2$, without significantly overshooting or failing to reach the target value. Information relating to the peak temperature may comprise at least one feedback parameter for use in establishing subsequent pulse parameters.

Figure 5:
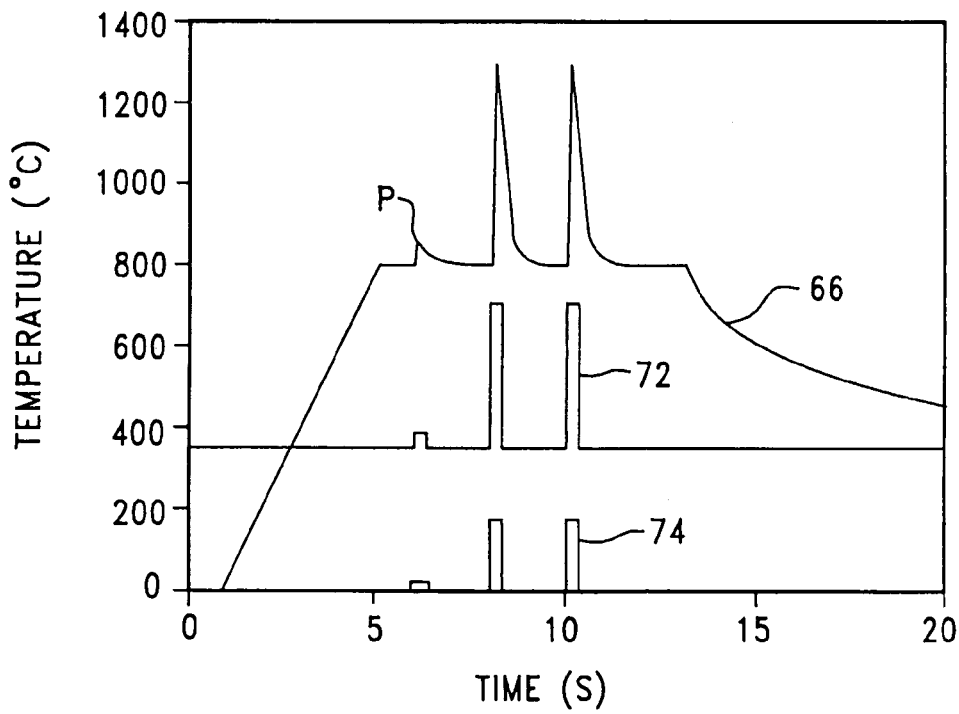
FIG. 5 is a graph illustrating a heating method according to a second embodiment of the invention—(i) plotting temperature in ° C. versus time in seconds for heating profiles for the front surface and back side of a wafer heated with a background heater and with its surface heated by radiation from multiple pulses from a pulse heating source; and (ii) plotting pulse heater power versus time in seconds.
Figure 6:
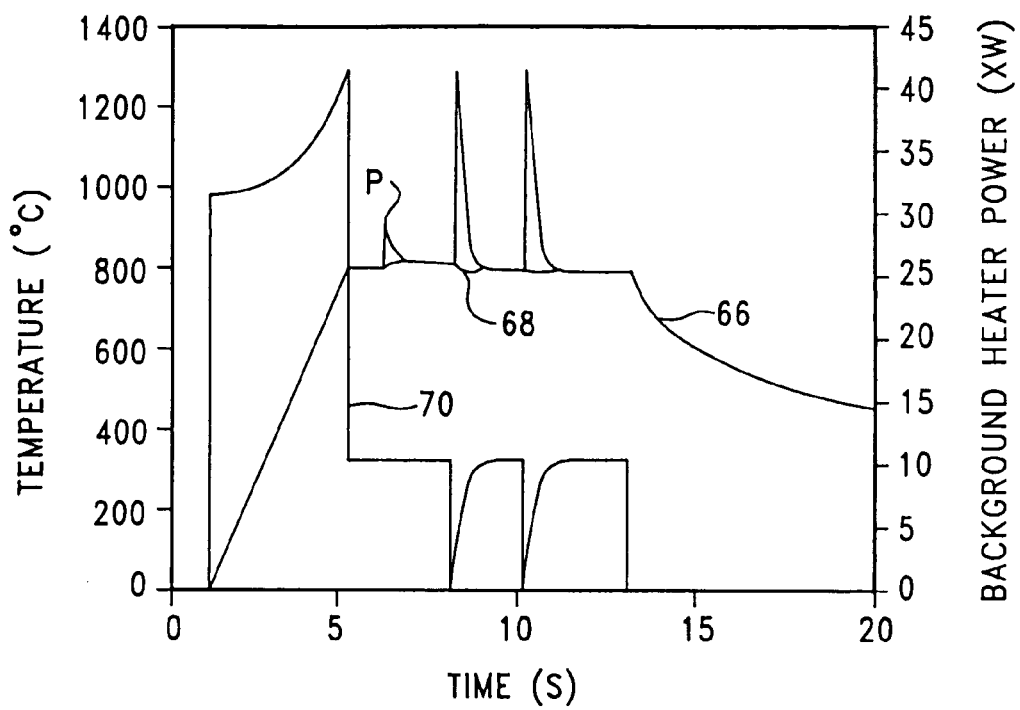
FIG. 6 is a graph illustrating a heating method according to a third embodiment of the invention—(i) plotting temperature in ° C. versus time in seconds for heating profiles for the surface and back side of a wafer heated with a background heater and with its surface heated by radiation from multiple pulses from a pulse heating source; and (ii) plotting background heater power in kW versus time in seconds for the background heater.
Figure 7:
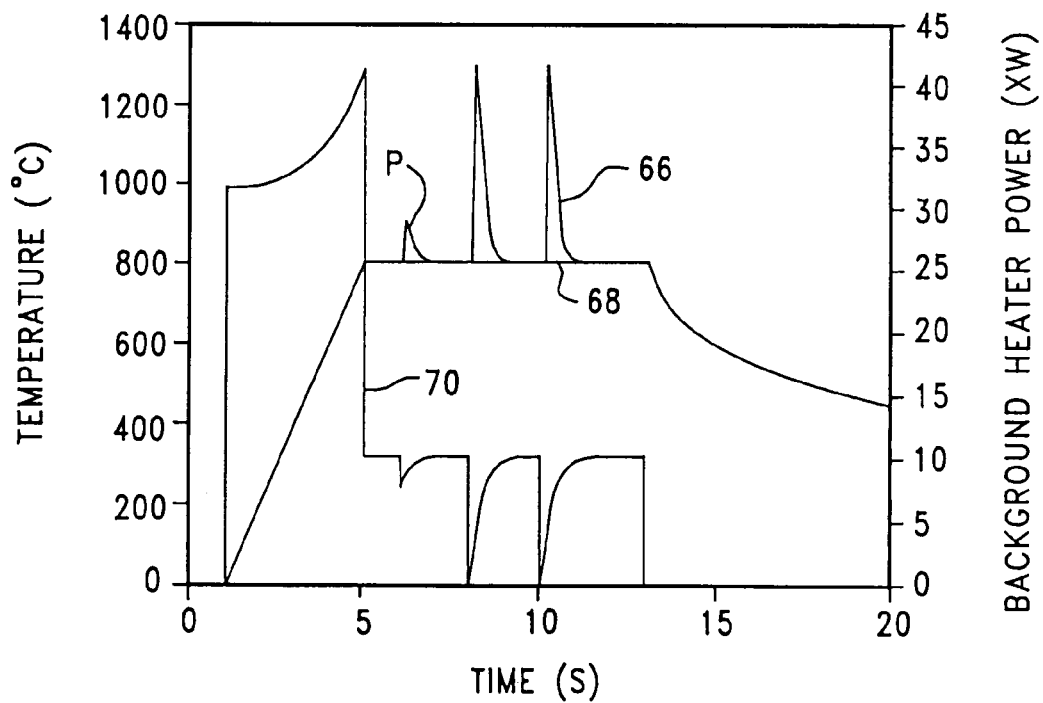
FIG. 7 is a graph illustrating a heating method according to a fourth embodiment of the invention—(i) plotting temperature in ° C. versus time in seconds for heating profiles for the surface and back side of a wafer heated with a background heater and with its surface heated by radiation from multiple pulses from a pulse heating source; and (ii) plotting background heater power in kW versus time in seconds for the background heater.

In certain embodiments, illustrated graphically in FIGS. 5 to 7, a low energy pre-pulse is emitted by the pulse energy source(s) to heat the front surface of the substrate. A reflected energy sensor samples the reflected light from the substrate, and a pulse energy sensor samples the light from the pulse source, which sampling measurements are used to estimate the substrate surface reflectivity. The subsequent pulses are then activated to heat the front side of the substrate, while taking the substrate surface reflectivity into account.

Referring to FIG. 5, a pre-pulse results in a pre-pulse response P to heat the surface of the substrate about 50° C. more than the first steady-state temperature. Curves showing the relative magnitudes of the pulse energy 72 and the reflected energy 74 are provided also in FIG. 5. The pre-pulse energy density may be in the range of 1 nJ/cm$^2$ to 10 J/cm$^2$. For annealing, the bulk of the semiconductor wafer (that is the first temperature) would be maintained preferably in the range of 400° C. to 950° C. For other applications, the first temperature could be in the range of room temperature (about 25° C.) to 1400° C. As will be further described, the pre-pulse technique of the present invention is considered as being highly advantageous at least for the reason that a pre-pulse (or any pulse which precedes another pulse) may be used to determine a predicted response of an object being treated to a subsequent pulse. The predicted response may be based on producing a target condition in the object using a single additional pulse or using a plurality of additional pulses wherein the target condition is incrementally approached using successive ones of the additional pulses. In the latter implementation, the parameters for each additional pulse are established in this predictive manner in a way which is intended to at least partially produce the target condition in the treatment object.

In the heating recipe shown in FIG. 6 the pre-pulse P is applied without feedback loop process control for the first heating source. Hence, the power to the first heating source is not deactivated when the pre-pulse P is applied, and the temperature of the backside of the substrate rises slightly above the first temperature (800° C.) to a new, somewhat steady state temperature just above the first temperature.

In contrast, in the heating recipe shown in FIG. 7, a feedback control loop is activated to control the power to the first heating source such that the power is shut off before or when pre-pulse P is applied to heat the front or device side of the substrate. Accordingly, the backside temperature of the substrate remains at or very near the first temperature (i.e. 800° C.) throughout application of the pre-pulse and the other pulses of the pulsed heating.

Alternatively, rather than a pre-pulse P, the reflectivity of the substrate surface may be estimated from the sensor data obtained upon the first pulse for heating the front or device side surface of the substrate in a multi-pulse processing regime.

Figure 8:
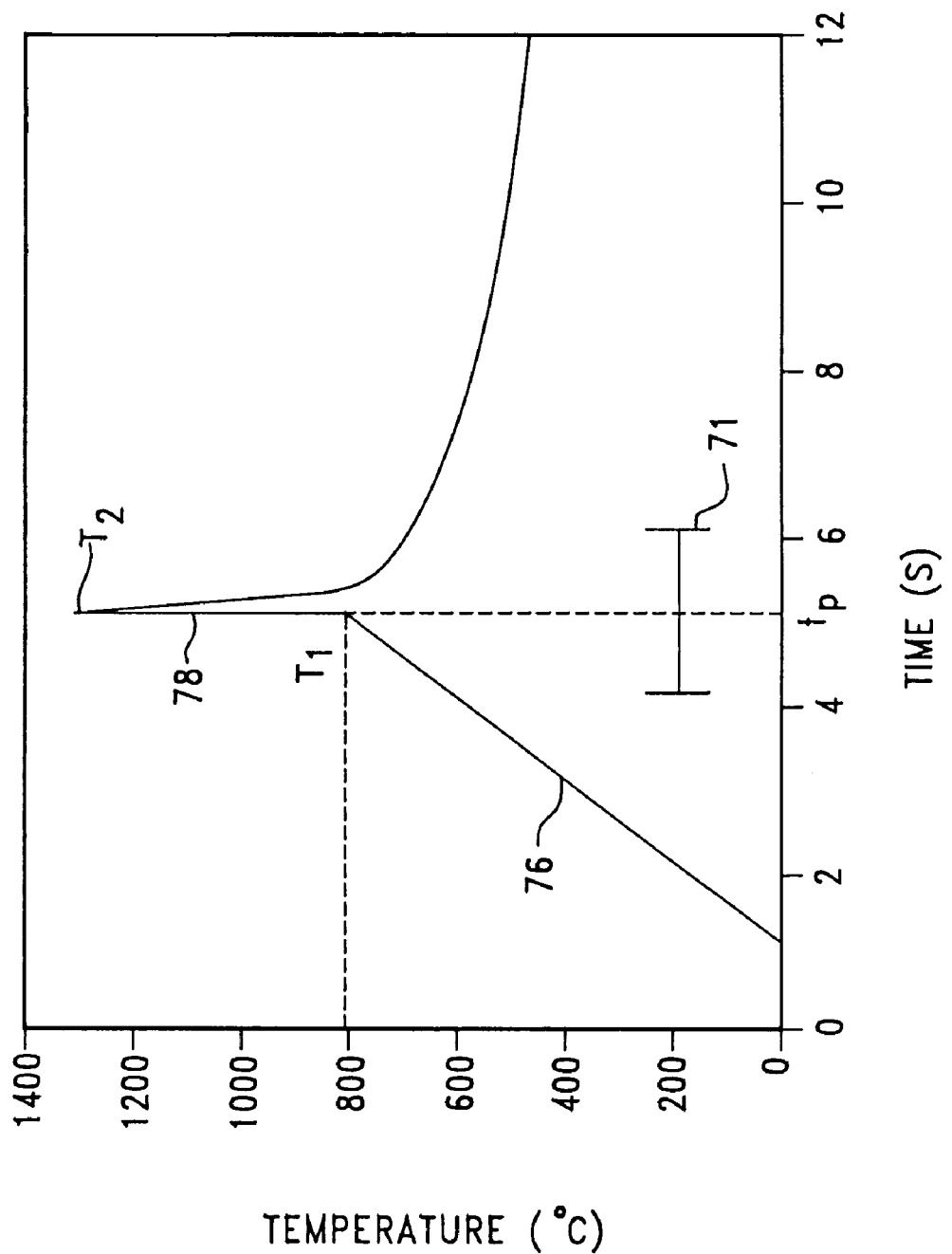
FIG. 8 is a graph illustrating a heating method according to a fifth embodiment of the invention plotting substrate surface temperature in ° C. versus time in seconds for a heating profile in which an energy pulse is applied to rapidly heat the substrate surface from a first temperature to a desired higher temperature without holding the substrate at the first temperature, the substrate is subjected to a continuously changing temperature.

FIG. 8 depicts a heating profile that may be more suitable for a tighter thermal budget wherein a steady state heating interval is not desired. A first heating source heats the substrate, such as a semiconductor wafer, to a first temperature $T_1$ (e.g., 800° C.). The ramp 76 in FIG. 8 represents one exemplary heating profile by the first heating source. A single ramp-up step as shown in FIG. 8 or several steps or other heating profile may be used in this embodiment. A variable ramp-up rate may be used. Just as the substrate reaches the first temperature $T_1$, or beyond $T_1$, and without holding the substrate at that temperature for substantial time, a pulsed heating source is activated to apply a pulse of energy $E_p$ to heat the front side of substrate surface to a second temperature $T_2$, higher than the first temperature (e.g., $T_2$=1300° C.). The spike 78 represents the pulsed heating by the pulsed heating source. Spike 78 begins at the point the surface temperature of the wafer reaches 800° C. In FIG. 8, the first heating source and pulsed heating source are de-activated after a single pulse to allow the substrate to cool, although it is to be understood that other regimes may also be used in view of the teachings herein. The first heating source and pulsed heating source may comprise separate sources, but such heating profile may also be achieved using a single heating source. As an example, lamps 46 of FIG. 1 may be replaced with a multimode heating source such as, for example, multimode arc lamps. In such a modification, it should be appreciated that heating is accomplished by applying heat to the front or first surface of the object immediately confronting the multimode source in both its background and pulsed heating modes. As another modification, a multimode source may be configured for applying background heating to the second or back surface of the object, for example, using a movable mirror arrangement (not shown). The present application contemplates the term "multimode," with reference to a heat source as encompassing any heat source which is capable of selectively delivering heat at rates which are representative of lower, background heating rates for relatively long time durations and at high, pulsed heating rates over relatively short delivery periods thereby emulating both prior art background and pulsed heating apparatus.

Still referring to FIG. 8, it should be appreciated that application of pulse 78 may be performed in timed relation to reaching temperature $T_1$. At the same time, background heating may be controlled in timed relation to either reaching temperature $T_1$ or initiation of pulse 78 at time $t_p$, for example within interval 71. It should be appreciated that this control may be implemented with a great deal of flexibility including in a predictive sense. For instance, background heating may be reduced or entirely terminated prior to reaching $T_1$ such that the temperature continues to rise to $T_1$ due to, for example, residual output from the background heat source arising as a result of its time constant. Application of pulse 78 may then be performed responsive to reaching $T_1$ (including after a delay) or in a predictive sense, for example, within an interval defined between reducing background heating and reaching $T_1$. In still another alternative, upon reaching $T_1$, background heating can be reduced and pulse firing may occur responsive to cool-down to a defined temperature. It is worthwhile to note that, by implementing the heating profile of FIG. 8 without a steady state interval, the object being treated is subjected to continuous temperature change.

Preferably, the power delivered by the first heat source is reduced in magnitude to between 0 to 90% at a time in the interval between one second before to 1 second after the pulse. Preferably, the power to the first heating source is reduced in magnitude to about 50% or less, and most preferably to about 10% or less. If a single heating source is used, the background heating power delivered by that single heat source preferably is reduced in magnitude to 0 to 90%, more preferably less than 50% and most preferably less than 10%, at a time in the interval between 1 second before to 1 second after the pulse.

In one embodiment $T_1$>800° C. and the maximum instantaneous ramp-up rate is $\geq$10° C./second, preferably $\geq$20° C./second. In a second embodiment, $T_1$>900° C. and the maximum instantaneous ramp-up rate is $\geq$20° C./second, preferably $\geq$50° C./second. In a third embodiment, $T_1$>950° C. and the maximum instantaneous ramp-up rate is $\geq$50° C./second, preferably 100° C./second. In a fourth embodiment, $T_1$>1000° C. and the maximum instantaneous ramp-up rate is $\geq$75° C./second, preferably 150° C./second.

In general for the embodiment illustrated in FIG. 8, as well as any pulsed heating approach seen herein, the second temperature, $T_2$, may be in the range of 800° C.-1450° C. The pulse energy, $E_p$, preferably is chosen so that $T_2$ is below the melting point of the substrate. Alternatively, $E_p$ may be chosen to create a surface melt on the front side of the substrate. The pulsewidth of the energy pulse may be in the range of 1 nanosecond to 50 milliseconds.

Briefly considering temperature constraints and ranges in the context of pulse mode heating, for a high temperature process such as ion-implant annealing, the process temperature is usually greater than 950° C. At this temperature, diffusion of dopants is rapid, and time at temperature has to be minimized. Because of a strong (exponential) temperature dependence of diffusion, time constraints are far more significant at 1000° C., than at 950° C., so a "sliding scale" of tolerable times versus temperature (this is the "thermal budget"—and its limit reduces as device technology advances) is imposed. At this point, ramp heating rates and cooling rates become very relevant. A fairly high temperature, for example, approximately 1050° C. is tolerable for state of the art devices, so long as there is essentially zero dwell time at 1050° C. and the ramp and cooling rates are greater than approximately 75° C./s, for example (which adds up to less than approximately 1.4 seconds total time spent at T>1000° C.). This gives the reader an appreciation for the kinds of conditions expected for the ramp+pulse type approach illustrated in FIG. 8 and similar implementations. Of course, for next generation devices, permitted limits will decrease and, therefore, these limits are to be adjusted accordingly. Note that in practice it may desired to ramp to 950° C. (rather than 1000° C.) at 100° C./s, fire the pulse and then allow cooling (at a rate greater than 50° C./s, for example). The extra 50° C. makes a very large difference to the diffusion problem, and is a relatively small temperature change (in terms of how much extra energy is required for the pulse to create a temperature rise to a desired process temperature).

These arguments are relatively straightforward for the ion-implant anneal application, but for other processes that are mentioned here, the "rules" can be quite different.

In order to process a wafer with pulse mode heating, preheating to some background temperature is usually desired for two reasons. The first reason is that it reduces the energy needed in the pulse. The second reason is that processing silicon wafers with a strong thermal shock is very likely to cause fracture if the wafer temperature is less than approximately 500° C. So the background temperature is likely to be at least 500° C., when the peak process temperature is greater than 900° C. As described above, the background temperature is strongly affected by the permissible thermal budget. For advanced ion-implant anneal processes, if a "soak+pulse" approach is considered, as shown, for example, in FIG. 5, background temperatures are likely to be below 950° C. For "complete" immunity to diffusion effects when using low-energy implants for creating advanced device structures, it is generally desired to at approximately 800° C. or below.

materials that require processing at very high temperatures—for example SiC, GaN and diamond can serve as semiconductors for some special devices. Some of these materials can be annealed at temperatures as high or higher than 1700° C., using the teachings herein.

The embodiment of FIG. 8 may be preceded by a pre-pulse (or test pulse) for feedback control purposes, as will be further described. Moreover, pulse 78 may comprise a treatment pulse which is used to formulate parameters of one or more additional pulses. It may also be used in any multi-pulse mode according to any of the figures included herewith along with processes shown in FIGS. 9 to 11 discussed hereinafter.

The values in the accompanying flow diagrams and equations below are defined in Table 1.

TABLE 1

| | | |
|---|---|---|
| $T_1$ | First Temperature | The temperature at which the wafer is stabilized or reaches prior to applying the pre-pulse |
| $T_2$ | Second Temperature | The temperature to which the wafer is targeted to be raised using pulse heating |
| $T_m$ | Intermediate temperature | Optional measured wafer temperature during processing just before applying the pulse. |
| $T_\alpha$ | | Peak temperature attained by the wafer surface on application of pre-pulse |
| $T_\beta$ | | Peak temperature of the wafer surface on application of pulse |
| $T_\lambda$ | | Bulk temperature rise of the wafer on application of pre-pulse |
| $T_\phi$ | | Bulk temperature rise of the wafer on application of pulse |
| P | Pulse power density | Lamp power per unit wafer area |
| $E_{pr}$ | Pre-pulse energy | Lamp energy during pre-pulse |
| $E_p$ | Pulse energy | Lamp energy during pulse heating |
| $\Omega$ | Pulsewidth for pulse heating | The definition depends on the power supply. For variable pulsewidth power supply, it is the time interval over which $E_p$ is applied. For fixed pulsewidth power supplies, this is defined usually as the width of the pulse-energy-versus-time profile taken at an energy value that is half of the maximum energy (FWHM, or full width at half maximum) |
| $\omega$ | Pulsewidth for pre-pulse | |
| $S_p$ | Pulse sampling time | The time from the application of the pulse till the wafer temperature becomes uniform along the thickness. This can be between one to five times the thermal diffusion time constant. |
| $F_1, F_2, F_3$ | | constants which are defined by wafer properties and pulsewidth |
| $\eta$ | Geometric efficiency | Exchange factor from lamp to wafer, determined a priori for the system |
| $A_w$ | Surface area of the wafer | |
| t | Time | |
| $\rho$ | Wafer density | |
| $C_p$ | Wafer specific heat | |
| k | Wafer thermal conductivity | |
| $\delta$ | Wafer thickness | |
| $\gamma_{pr}$ | thermal diffusion length over a time period equal to the pre-pulse pulsewidth, $\omega$ | |
| $\gamma_p$ | thermal diffusion length over a time period equal to the pulsewidth $\Omega$ | |
| $\alpha$ | broadband wafer absorptivity to lamp radiation | |
| $\tau$ | Wafer broadband transmissivity | |
| r | Wafer broadband reflectivity to lamp radiation | |
| $\psi_p$ | Optical efficiency for pulse heating | Electrical-to-optical conversion efficiency of flashlamp for the pulse. This is determined a priori for the lamp. |
| $\psi_{pr}$ | Optical efficiency for pre-pulse | Electrical-to-optical conversion efficiency of flashlamp for pre-pulse. This is determined a priori for the lamp. |

Figure 9:
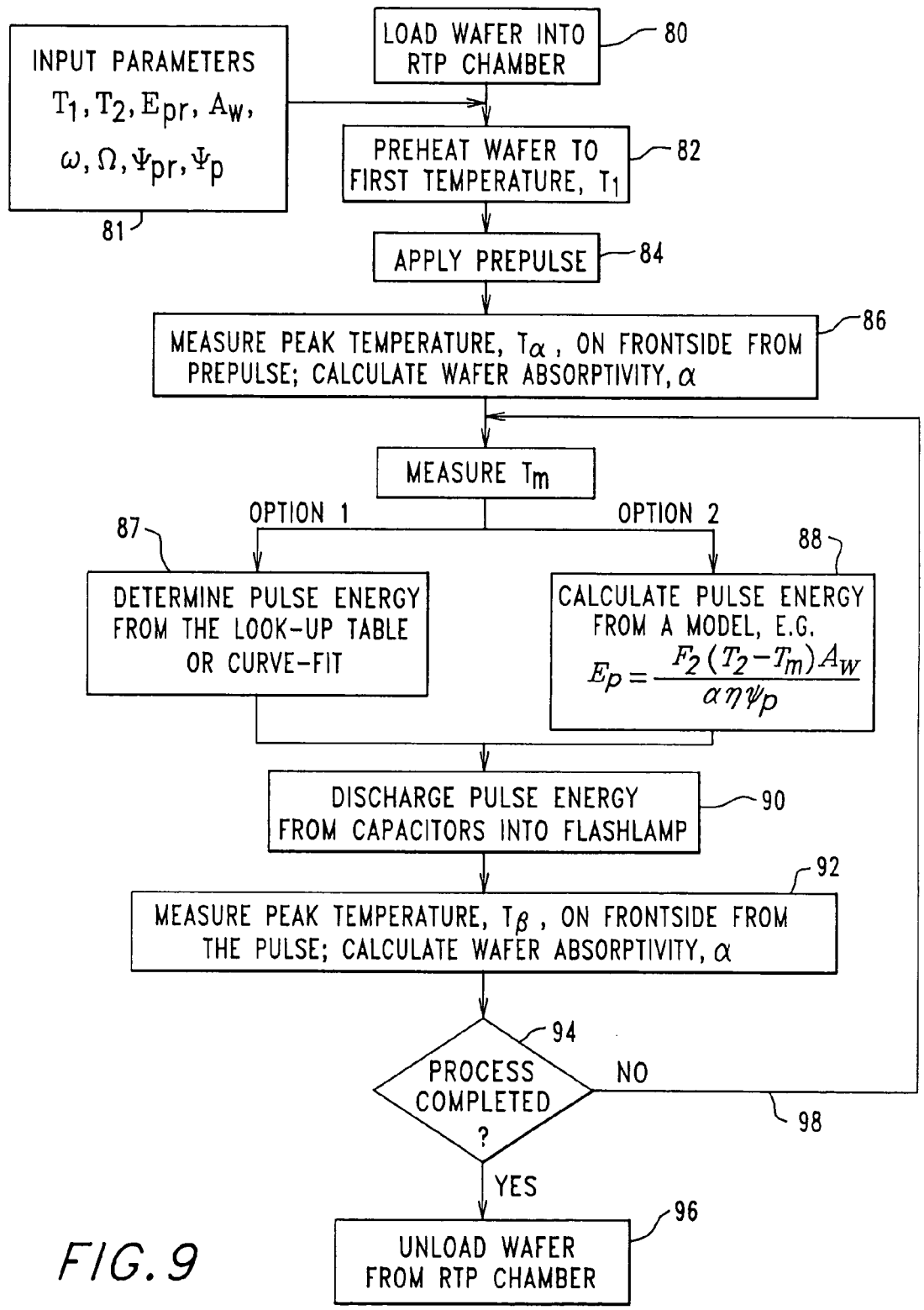
FIG. 9 is a flow diagram illustrating a sequence for closed loop feedback control of the frontside or first surface substrate temperature.
Figure 10:
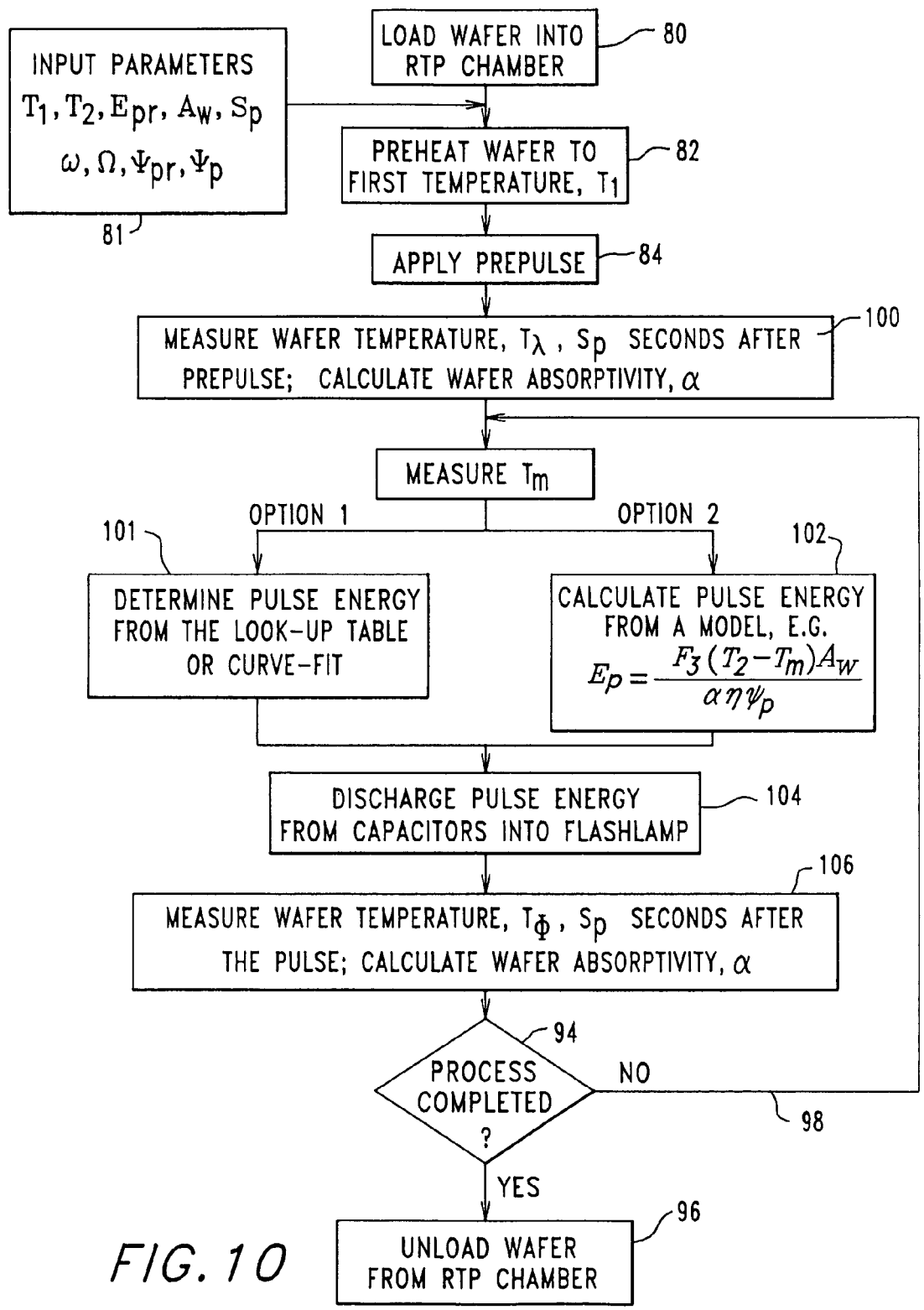
FIG. 10 is a flow diagram illustrating a sequence for closed loop feedback control of energy pulses for heating a substrate.
Figure 11:
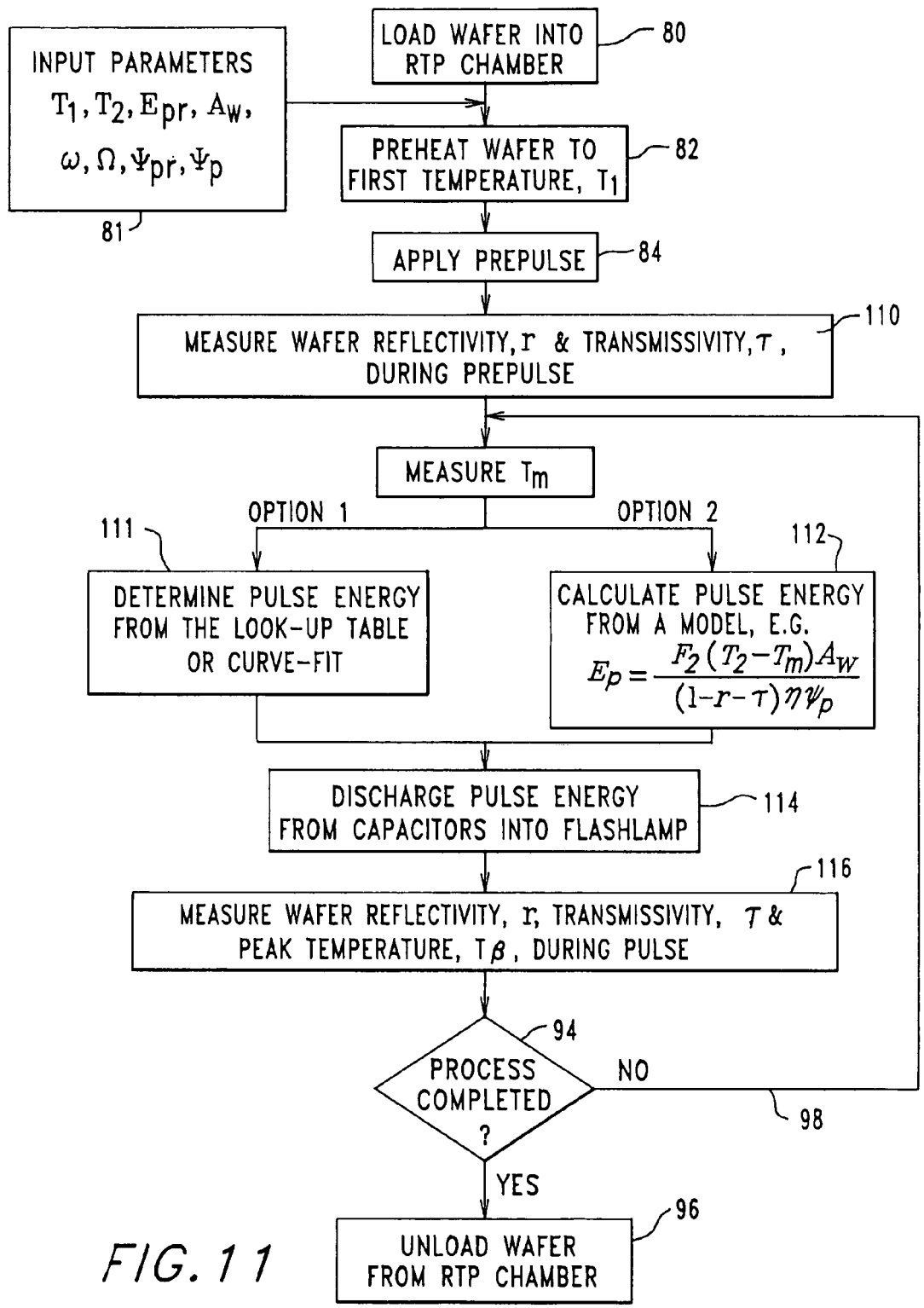
FIG. 11 is a flow diagram illustrating a sequence for closed loop feedback control of substrate temperature in view of substrate reflectivity and transmissivity during pulsed heating.

Another significant temperature, in the context of this overall discussion, is 1410° C., because this is the melting point of silicon. Generally, melting of silicon is not desired, thereby imposing an upper limit for most silicon applications. However, looking into the future, there are some Referring now to FIGS. 9 to 11, process flow diagrams illustrate various closed loop feedback control for pulsed heating methods according to the invention. These methods are useful for in-situ estimation of the wafer optical properties, which, in turn, enables an accurate estimation of the pulse energy required to raise the wafer surface to the desired treating temperature, $T_2$. In FIG. 9, the feedback is based upon measured substrate frontside temperature compared against a target or desired treating temperature. In FIG. 10, the feedback is based upon the incremental change in substrate temperature (either surface can be used) compared at a defined time interval after an energy pulse has been applied. In FIG. 11, the feedback is based upon measured substrate reflectivity and transmissivity.

The measured parameter in each of FIGS. 9 to 11 is related to lamp energy, $E_p$, through a model, and the model calculation provides an estimate of the required pulse parameters ($E_p$ and $\Omega$) for the next pulse. Pulse-to-pulse manipulation of the pulse parameters provides a mechanism for feedback control of the wafer temperature rise during pulse processing.

When processing is carried out using multiple pulses, energy absorption causes the substrate temperature to increase between pulses. For instance, if the substrate is heated to a first temperature $T_1$, and then an energy pulse is applied to the front surface, the temperature of the front surface rapidly increases to the processing temperature, $T_2$, while the backside remains close to $T_1$ during the pulse. The front surface temperature then rapidly declines by conduction cooling to the underlying substrate which tends to equalize the substrate temperature through the thickness. In this process, the energy absorbed during the pulse heating causes the substrate to reach an intermediate temperature, $T_m$, which then reduces further by radiation cooling. Prior to the application of the next pulse, $T_m$ can be measured so as to provide an improved estimate of the energy required for the next pulse.

In an alternative arrangement, the pulse parameters may be estimated from a pre-programmed look-up table or an empirically determined surface-fit. In one option, a series of experiments are conducted a priori (i.e., before heat-treating desired wafer substrates). The wafer temperature response is recorded for different combinations of $T_1$, $T_\beta$, $\Omega$ and $E_p$. These results are incorporated into a look-up table and stored in the computer. During a particular processing run, $T_1$ and $\Omega$ are pre-set in the recipe, and $T_\beta$ is measured. The computer then accesses the look-up table to retrieve $E_p$ for the required $T_2$. If the exact value of $T_2$ is not available in the look-up table, an interpolation is performed between the values that surround $T_2$. This option is denoted as "Option 1" in FIGS. 9 to 11.

Alternatively, in "Option 1" the experimentally generated data can be stored in the form of a surface-fit. In this case, the fit takes the form $$E_p = f(\Omega, T_1, T_\beta, T_2, A_w, \eta, \alpha, \psi_p) \tag{1}$$

In the above equations, all the variables in the RHS are known, either through preset values in the recipe, or through measurement. $E_p$ can thus be calculated from the functional relationship. This approach can be applied to all of the methods in the flow charts shown in FIGS. 9 to 11.

Substrate (Wafer) Temperature Measured at the Top Surface During the Pulse

Referring next to FIG. 9, the feedback control is based upon frontside temperature compared against a target or desired treating temperature. After the wafer is loaded 80 into the processing chamber, input parameters are identified for the heating in step 81. A backside heating temperature $T_1$ and a frontside heating temperature $T_2$ are predetermined values. The pre-pulse energy $E_{pr}$ and the pulse width $\omega$ are also predetermined values, according to a desired heating recipe. The wafer is preheated 82 to the first temperature $T_1$. Upon reaching $T_1$, a pre-pulse 84 is applied according to pre-pulse energy $E_{pr}$. The peak temperature rise of the front side of the wafer as a result of the pre-pulse, $T_\alpha$, is determined through pyrometric techniques 86 and may be considered as a temperature response of the substrate. Knowledge of $T_\alpha$, temperature attained responsive to the pre-pulse, and the pre-pulse parameters are used to determine the wafer absorptivity, $\alpha$. The pulse energy either is determined from the look-up Table or curve fit ("Option 1") in step 87 or calculated in step 88 as a function of $T_1$, $T_\alpha$ and $T_2$ ("Option 2") for subsequent pulses.

If radiation losses are neglected during the pulse, the heating rate can be related to the power supplied by $$\rho C_p \gamma \frac{dT}{dt} = \alpha \eta \psi P \tag{1}$$

Here, $\gamma$ is the thermal diffusion thickness corresponding to the pulse width. For the pre-pulse, $\gamma = \gamma_{pr}$ and for pulse heating, $\gamma = \gamma_p$. These are given by $$\gamma_{pr} = \sqrt{D\omega} = \sqrt{\frac{k}{\rho C_p}\omega} \qquad \gamma_p = \sqrt{D\Omega} = \sqrt{\frac{k}{\rho C_p}\Omega} \tag{2}$$

and $\psi$ is the optical conversion efficiency of the flashlamp. $\psi = \psi_{pr}$ when the pre-pulse is applied and $\psi = \psi_p$ for pulse heating. $\psi_{pr}$ and $\psi_p$ are characteristic of the flashlamp, and are determined a priori and stored for use during processing.

The temperature rise of the top surface of the wafer is measured during the pre-pulse of power density $P_{pr}$ (energy $E_{pr}$). This yields $$\int_{T_1}^{T_\alpha} \rho C_p \gamma_{pr} dT = \int_0^\omega \alpha \eta \psi_{pr} P_{pr} dt \tag{3}$$

From the above equation, the absorptivity $\alpha$ can be determined $$\alpha = \frac{F_1(T_\alpha - T_1)A_w}{\eta \psi_{pr} E_{pr}} \tag{4}$$

where $$F_1 = \frac{\int_{T_1}^{T_\alpha} \sqrt{\rho C_p k} \sqrt{\omega}\, dT}{T_\alpha - T_1} \tag{5}$$

If the wafer absorptivity is constant, the required pulse energy for a given temperature rise, $(T_2 - T_m)$, is estimated as $$E_p = \frac{F_2(T_2 - T_m)A_w}{\alpha \eta \psi_p} \tag{6}$$

where $$F_2 = \frac{\int_{T_1}^{T_2} \sqrt{\rho C_p k} \sqrt{\Omega}\, dT}{T_2 - T_m} \tag{7}$$

Using the determined or calculated value, pulse energy is discharged 90 to the flash lamp to cause the lamp to emit a pulse to heat the frontside of the wafer. Following this pulse, the temperature of the frontside of the wafer is determined 92 through pyrometric techniques. The wafer absorptivity is recalculated using the measurement of the surface temperature. If a next pulse is to be applied, the system loops back to calculate 88 the pulse energy of the next pulse as a function of $T_1$, $T_\alpha$ and $T_2$. Once the desired heating process is completed, the wafer may be unloaded 96 from the processing chamber. Essentially, this technique relies on an induced temperature rise. The response of the substrate or other such object undergoing processing is sensed as an increase in temperature. This sensed temperature increase then forms the basis for establishing treatment parameters such as, for example, pulse parameters for use in subsequent processing of the object being treated. Characteristics of the treatment object such as absorptivity are readily determined during this highly advantageous procedure.

Wafer Temperature Measured at the Top or Bottom Surface "$S_p$" Seconds After the Pulse Referring now to FIG. 10, this feedback control method relies on measurement of bulk wafer temperature rise as a result of absorption of pulse energy. For this, the temperature rise can be determined by measurement of the wafer temperature, and specifically, either at the top surface or at the bottom surface of the wafer. To the extent that steps in this method are identical to those of the method of FIG. 9, like reference numbers have been applied.

The feedback, in the present example, is based upon the incremental change in wafer temperature determined by comparing a temperature that is measured prior to the pulse to a post-pulse temperature determined at a defined time interval after an energy pulse has been applied. After the wafer is loaded 80 into the processing chamber, processing parameters for the heating are identified. Backside heating temperature, $T_1$, target frontside heating temperature $T_2$, pre-pulse energy $E_{pr}$, pre-pulse pulse width $\omega$), and sampling time $S_p$ are defined. The wafer is preheated 82 to the first temperature $T_1$. A pre-pulse is applied 84 at a known pre-pulse energy $E_{pr}$ and pulse width $\omega$. The rise in wafer temperature, $T_\lambda$, (of either the front side or the back side) is measured 100 by pyrometric techniques at a certain time interval ($S_p$ seconds) after the pre-pulse. Using the pre-pulse parameters and $T_\lambda$, the wafer absorptivity is calculated. A pulse energy either is determined 101 from a look-up table or curve fit ("Option 1") or is calculated 102 as a function of $T_1$, $T_\alpha$ and $T_2$ ("Option 2") for subsequent pulses.

If radiation losses are neglected during the pulse, the total energy absorbed by the wafer from the pulse can be related to wafer heating by $$\int_{T_1}^{T_\phi} \rho C_p \delta \cdot dT = \int_0^{S_p} \alpha \eta \psi_p P dt \tag{b1}$$

The wafer absorptivity $\alpha$ in the RHS (Right Hand Side) of the above equation is determined by application of pre-pulse with energy $E_{pr}$ $$\alpha = \frac{A_w \int_{T_1}^{T_\lambda} \rho C_p \delta \cdot dT}{\eta \psi_{pr} E_{pr}} \tag{b2}$$

If the thermophysical properties do not change significantly over timescales of the order of the pulsewidth, the required pulse energy to generate the required temperature rise is $$E_p = \frac{\rho C_p \gamma_p \cdot (T_2 - T_m) A_w}{\alpha \eta \psi_p} = \frac{F_3 (T_2 - T_m) A_w}{\alpha \eta \psi_p} \tag{b3}$$

where $$F_3 = \sqrt{\rho C_p k \Omega} \tag{b4}$$

Using the determined or calculated value, pulse energy, $E_p$, is discharged 104 to the flash lamp to cause the lamp to emit a pulse to heat the frontside of the wafer. The wafer temperature (of either the frontside or the backside) is determined 106 through pyrometric techniques at a time interval $S_p$ seconds after the pulse, and the wafer absorptivity is recalculated. If a subsequent pulse is to be applied, the pulse energy required is recalculated from either a look-up table or a curve-fit ("Option 1") or from a model ("Option 2") as indicated in FIG. 10. Once the heating process is completed, the wafer may be unloaded 96 from the processing chamber. Like the procedure described immediately above with regard to FIG. 9, this procedure relies on an induced temperature rise. The response of the substrate, or other such object undergoing processing, is sensed as an increase in temperature, but at some time after the application of the pulse rather than during the pulse. Again, this sensed temperature increase then forms the basis for establishing treatment parameters such as, for example, pulse parameters for use in subsequent processing of the object being treated. Further, characteristics of the treatment object including absorptivity are readily determined during this implementation.

Irrespective of when the temperature response sensed, it is important to note that reliance on an induced temperature rise is considered as being highly advantageous at least for the reason that the induced temperature rise is responsive to any number of physical characteristics at the substrate which will influence the application of any subsequent pulses. These physical characteristics include, but are not limited to reflectivity, absorptivity, specific heat, thermal conductivity, material density and structure (e.g multilayer structure will have optical and thermal impact). One of ordinary skill in the art will appreciate, therefore, that such physical characteristics are not limited to optical characteristics which comprise only a subset of possible temperature response influencing conditions. Moreover, any combination of these conditions will produce a highly advantageous collective response without the need to identify which physical characteristic produces which portion of the temperature response. In essence, a pre-pulse, or any suitable pulse, is used to produce an empirical basis for subsequent treatment.

At this juncture, it is appropriate to note that the use of a pre-pulse (or any suitable pulse) is attended by a particular advantage with regard to heating apparatus. Specifically, the same heating apparatus may be used to apply the pre-pulse as the treatment pulse. In this way, the geometrical relationship, for example, between the lamps of a heating arrangement and a wafer is very similar, if not identical, for the diagnostic pre-pulse as for the processing/treatment pulse. For example, when estimating absorptivity, geometric factors, such as the distribution of angles of incidence of the heating radiation on the wafer, are important. Keeping the geometry constant, as taught by the present invention, is highly advantageous by allowing for a more accurate prediction of the pulse energy needed, without introducing extra steps of characterization and extrapolation.

Reflectivity and Transmissivity Measured

Referring next to FIG. 11, the feedback is based upon the measured wafer reflectivity, r, and transmissivity, T, during application of an energy pulse. After the wafer is loaded 80 into the processing chamber, processing parameters for the heating are identified. Backside heating temperature, $T_1$, target frontside heating temperature $T_2$, pre-pulse energy $E_{pr}$, pulse width $\omega$, and other parameters are defined. The wafer is preheated 82 to the first or temperature $T_1$. A pre-pulse is applied 84 at a known pre-pulse energy $E_{pr}$ and pulse width $\omega$. The wafer reflectivity and transmissivity are measured 110 by a sensor during the pre-pulse. It is noted that this step contemplates the use of any optical measurement which may serve as the basis for subsequent treatment. A pulse energy either is determined 111 from a look-up table or or curve fit ("Option 1") or is calculated 112 as a function of $T_1$ and $T_2$ ("Option 2") for subsequent pulses.

If radiation losses are neglected during the pulse, the heating rate can be related to the power supplied by $$\rho C_p \gamma \frac{dT}{dt} = \alpha \eta \psi P = (1 - r - \tau) \eta \psi P \quad (c1)$$

where the identity $\alpha=(1-r-\tau)$ is used. Here, $\gamma$ is the diffusion thickness corresponding to the pulsewidth. For the pre-pulse, $\gamma=\gamma_{pr}$ and for pulse heating, $\gamma=\gamma_p$. These are given by $$\gamma_{pr} = \sqrt{D\omega} = \sqrt{\frac{k}{\rho C_p}\omega} \qquad \gamma_p = \sqrt{D\Omega} = \sqrt{\frac{k}{\rho C_p}\Omega} \quad (c2)$$

and $\psi$ is the optical conversion efficiency of the flashlamp. $\psi=\psi_{pr}$ when the pre-pulse is applied and $\psi=\psi_p$ for pulse heating. $\psi_{pr}$ and $\psi_p$ are characteristic of the flashlamp, and are determined a priori and stored for use during processing.

A pre-pulse of power density $P_{pr}$ (energy $E_{pr}$) is applied to the wafer, and during the pre-pulse, the wafer reflectivity and transmissivity are measured. These values are stored for subsequent use. When a subsequent pulse of is applied, energy balance on the wafer yields $$\int_{T_m}^{T_2} \rho C_p \gamma_p dT = \int_0^\Omega (1 - r - \tau) \eta \psi_p P dt \quad (c3)$$

If the wafer reflectivity and transmissivity are constant, the required pulse energy for a given temperature rise, $(T_2-T_m)$, is estimated as follows $$E_p = \frac{F_2(T_2 - T_m)A_w}{(1 - r - \tau)\eta \psi_p} \text{ where} \quad (c6)$$

$$F_2 = \frac{\int_{T_m}^{T_2} \sqrt{\rho C_p k} \sqrt{\Omega} \, dT}{T_2 - T_m} \quad (c7)$$

Using the determined or calculated value for pulse energy, pulse energy is discharged 114 to the flash lamp to cause the lamp to emit a pulse to heat the frontside of the wafer. The peak temperature of the frontside of the wafer $T_\beta$ is determined 116 through pyrometric techniques during the pulse. The wafer reflectivity and transmissivity are again measured. If a further pulse is to be applied, the pulse energy is again determined or calculated. Once the process is completed, the wafer may be unloaded 96 from the processing chamber.

In the case of multiple pulse processing, performing these calculations in the feedback control for any of the methods of FIGS. 9 to 11 prior to each pulse ensures that changes in wafer properties, which may arise in the course of processing, are automatically compensated for in calculations of the pulse energy. It should be appreciated that the method and individual steps shown in FIGS. 9-11 may be rearranged in any suitable manner, particularly in the context of treatment using a series of pulses. In this context, it should be appreciated that pulse parameters of subsequently applied pulses may be determined based on more than one physical characteristic of the treatment object. For example, at different points in the application of the series of treatment pulses, different parameters may be of different importance. Moreover, the prioritization of importance for various parameters may change as the process proceeds. Further, a final value of some physical characteristic may be critical. In this instance, such a parameter can be tracked through the overall set of additional pulses even in conjunction with determining a different physical characteristic. For example, temperature rise may be employed in conjunction with monitoring of reflectivity. In this regard, where a particular parameter is desired to have a target value at the conclusion of treatment, it may be desirable to track that value relatively early in the overall processing scheme. That particular parameter may serve as an indication to terminate processing either along with or despite other parameter indications. Likewise, different physical parameters may be relied on alternately, or reaching a target value specified for one parameter may trigger monitoring or relying on a different parameter. In this regard, it should be appreciated that an unlimited range of possible configurations is contemplated, all of which are considered as being within the scope of the present invention.

While the foregoing discussion is submitted to enable one of ordinary skill in the art to make and use the invention, including all of its various features, it should be appreciated that these features may be combined in an almost unlimited number of ways. At this juncture, therefore, a number of alternative heating profiles will be described which illustrate the use of certain concepts taught above in order to provide an even more complete understanding of these concepts and the versatile manners in which they may be used.

Figure 12:
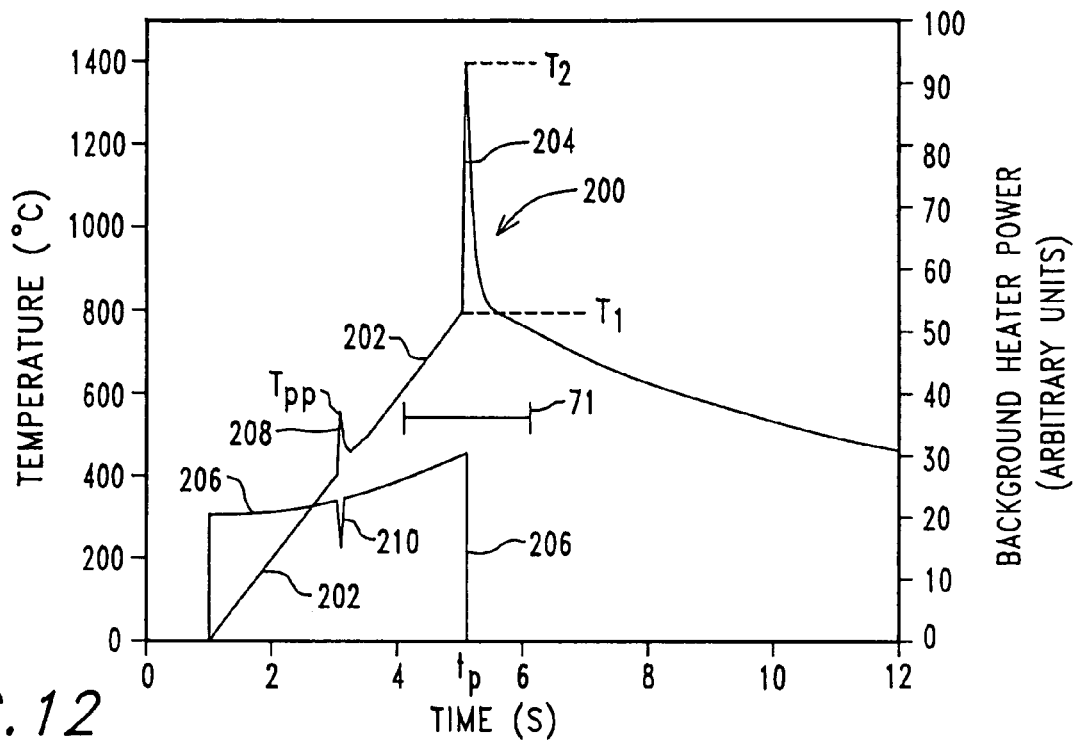
FIG. 12 is a plot illustrating a heating profile, performed in accordance with the present invention and shown here to illustrate a low thermal budget approach which incorporates a pre-pulse.

Referring to FIG. 12, a first alternative heating profile, performed in accordance with the present invention, is generally indicated by the reference number 200. Profile 200 illustrates the first surface temperature of a substrate, plotted against a vertical temperature scale at the left of the figure, and resembles the heat profile described with regard to FIG. 8 above, with certain differences to be described in detail. Like the profile of FIG. 8, heating profile 200 includes a ramp-up portion 202 which is terminated by a heat spike 204. The latter is the result of an exposure of the first surface of the substrate to a pulse of energy. It should be appreciated that the heating profile (as is true of all heat profiles described herein) may be applied by any suitable heating arrangement including separate background and pulsed heat sources or, alternatively, a multimode source capable of operating in both pulsed and background type heat modes. For purposes of descriptive clarity, however, the present example considers the use of separate background and pulse heating arrangements. Accordingly, a background heating plot 206 is plotted against a vertical heater power scale, using arbitrary units, to the right of the figure which is applied by the background heat source to produce ramp-up portion 202. Background heating is controlled in timed relation to application of the pulse which produces spike 204, for example, within interval 71 of $t_p$. In the present illustration, background heating is terminated with the application of the pulse that produces spike 204. Thereafter, the substrate is allowed to cool. It should be appreciated that it is equally applicable, throughout this overall disclosure, to consider that pulse initiation may be performed in timed relation to background heating. That is, the event of reaching $T_1$ (as a direct result of background heating), or a prediction thereof, may be used to initiate pulse heating, as well as reducing or terminating background heating.

Continuing to refer to FIG. 12, profile 200 further illustrates the results of application of a pre-pulse to the first surface by the pulsed heating arrangement during ramp-up portion 202 so as to produce a pre-pulse spike 208. In the present example, the pre-pulse is applied for measurement purposes, as opposed to accomplishing, or at least partially accomplishing, treatment of the substrate receiving the pre-pulse. Stated in a slightly different way, the pre-pulse is applied so as to produce a negligible result with regard to a desired or target condition of the substrate at the conclusion of processing. As will be described, however, this is not a requirement. It should also be noted that temperature $T_{pp}$, produced by the pre-pulse, is now lower than $T_1$ due to the position of the pre-pulse. Background heating is controlled, in accordance with the present invention, in highly advantageous timed relation to the application of the pre-pulse. In the present example, background power is reduced at the onset of pre-pulse heating in a negative spike 210 so as to generally resemble a mirror image of pre-pulse heat spike 208, thereby compensating in a way which causes the ramp-up portion of the heating cycle to proceed at the conclusion of the pre-pulse heat spike, as if the pre-pulse heat spike had not occurred. Moreover, is important to note that negative spike 210 may reduce the background heating by any suitable amount including completely turning it off, but in this example merely reduces the background heating by approximately one-third, sufficient to achieve the desired response seen in heating profile 200.

Figure 13:
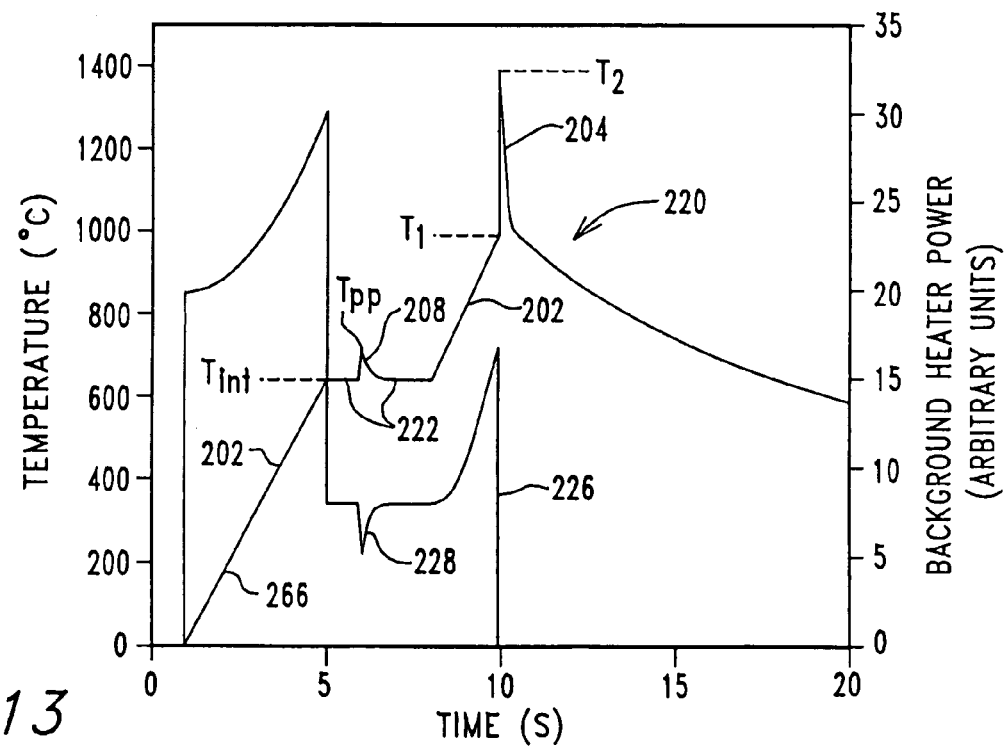
FIG. 13 is a plot illustrating a heating profile, performed in accordance with the present invention and resembling the heat profile of FIG. 12 with the exception that the pre-pulse is applied during a steady state interval which is inserted into the ramp-up interval.

Referring to FIG. 13, a second alternative heating profile, performed in accordance with the present invention, is generally indicated by the reference number 220. Profile 220 again illustrates the first surface temperature of the substrate plotted against a temperature scale to the left of the figure. Like the profile of FIG. 12, a ramp-up portion 202 is included which is terminated by heat spike 204. In this instance, however, an intermediate stabilization interval 222 is inserted into the ramp-up interval during which the substrate temperature is allowed to stabilize at a selected intermediate temperature, $T_{int}$. In the present example, the intermediate temperature is selected as approximately 650° C. Upon stabilization of the substrate temperature, at a selected point during the stabilization interval, a pre-pulse is applied so as to produce pre-pulse heat spike 208.

Still referring to FIG. 13, a background heating profile 226 is shown, plotted against an arbitrary heater power scale to the right of the figure, which cooperates with the application of the pre-pulse and subsequent treatment pulse. Once again, background heating is controlled, in accordance with the present invention, in highly advantageous timed relation to the application of the pre-pulse. In this example, background power is reduced at the onset of pre-pulse heating in a negative going spike 228 so as to at least generally resemble a mirror image of pre-pulse heat spike 208, thereby maintaining thermal stability in the temperature stabilization interval at least with respect to the second surface of the substrate. Ramp-up heating then resumes with the conclusion of the temperature stabilization interval. It should be understood that the pre-pulse concepts of FIGS. 12 & 13 remain useful even without such manipulations of the background heating power.

Figure 14:
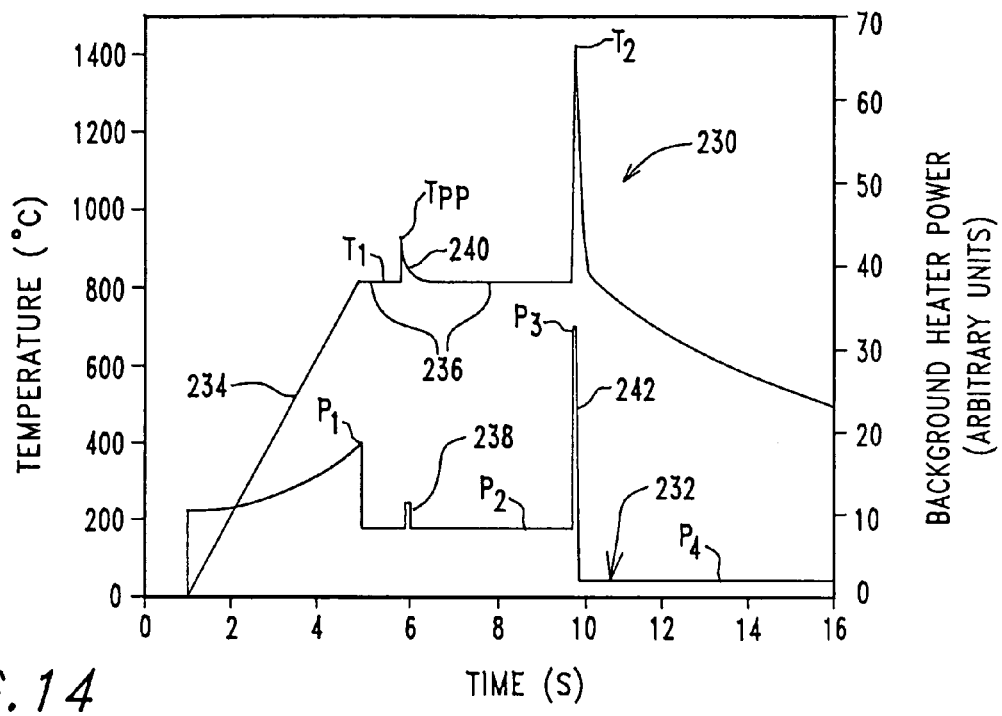
FIG. 14 is a plot illustrating a heating profile, performed in accordance with the present invention using a multimode heat source, shown here to illustrate exposure of a treatment object to a pre-pulse and a treatment pulse with the pre-pulse applied during a steady state interval.

FIG. 14 illustrates a third alternative heating profile, performed in accordance with the present invention and generally indicated by the reference number 230 which is performed using a single, multimode heat source and is plotted against a temperature scale appearing to the left of the figure. In this case, the processing is performed by modulating the power discharged from the heat source so as to generate the required temperature-time cycle for the wafer or object that is undergoing treatment. Radiant power delivered by the heat source is illustrated by an incident power plot that is indicated by the reference number 232 and which is plotted against a heater power scale appearing to the right of the figure. It is noted that this plot, like all heat source plots herein, represents radiant energy that is incident on the wafer. Actual input electrical power levels are to be adjusted accordingly in order to account for response characteristics of the particular source that is in use. It is noted that, while heater power is shown as a combination of inputs from background and from pulse energy modes, this combination appears essentially the same when separate background and pulse energy sources are used. In a ramp-up interval 234 of temperature profile 230, power delivered by the heater, as seen in incident powder plot 232, is increased to $P_1$ so as to heat the wafer to temperature $T_1$, essentially in an isothermal fashion. While the wafer is held at temperature $T_1$ during a steady state interval 236, a reduced power level, shown as $P_2$, is sufficient to balance heat lost from the wafer surfaces. During steady state interval 236, a pre-pulse 238 is applied by the multimode heat source. With the application of pre-pulse 238, the substrate exhibits a temperature response in the form of a pre-pulse temperature spike 240 in heat profile 230 which takes the temperature of the first surface to temperature $T_2$. As this additional heat dissipates, the first surface of the substrate cools again to $T_1$.

At a pre-determined time in the heating recipe, a treatment pulse 242 of additional energy is supplied to the heater, thereby boosting the power discharged by the heater to $P_3$ for a short interval of time. This causes a rapid heating of the wafer and raises the wafer surface temperature to $T_3$. Following this pulse, the power to the heater is reduced to a level, $P_4$, allowing the wafer to cool down. Pulse parameters of power pulse 242 are determined based, for example, on the response of the substrate in pre-pulse temperature spike 240. It is important to understand that the multimode source is capable of emulating essentially any behavior that is available using separate background and pulse heating sources. Moreover, treatment may continue in any suitable manner, as exemplified by any of the figures herein.

Referring generally to FIGS. 12-14, it should be appreciated that pre-pulses and treatment/power pulses may be applied in an unlimited number of ways, all of which are considered as being within the scope of the appended claims in view of this overall disclosure and as will be further described immediately hereinafter.

Figure 15:
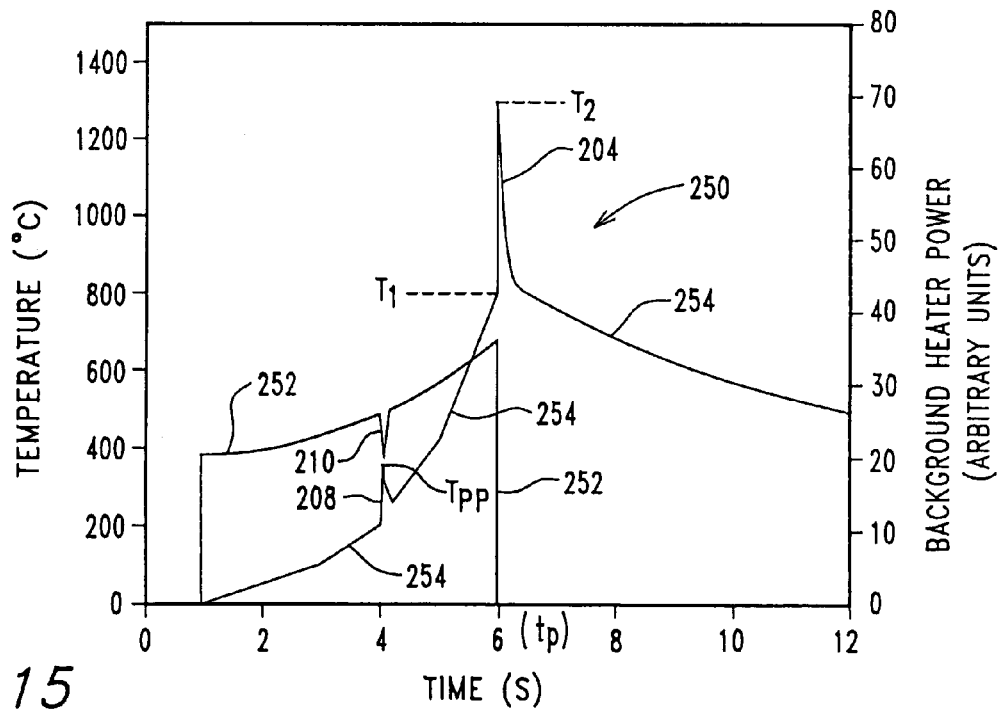
FIG. 15 is a plot illustrating a heating profile, performed in accordance with the present invention which shares the advantages of the heating profile of FIG. 12, but which further illustrates a multi-rate ramp-up heating interval.

FIG. 15 illustrates a heating profile 250 which shares all of the features and advantages of heating profile 200 shown in FIG. 12 and previously described. A further advantage may be observed in that profile 250 includes a background heating profile 252 which produces a ramp-up interval 254 that exhibits multiple ramp heating rates, providing still further process control.

Figure 16:
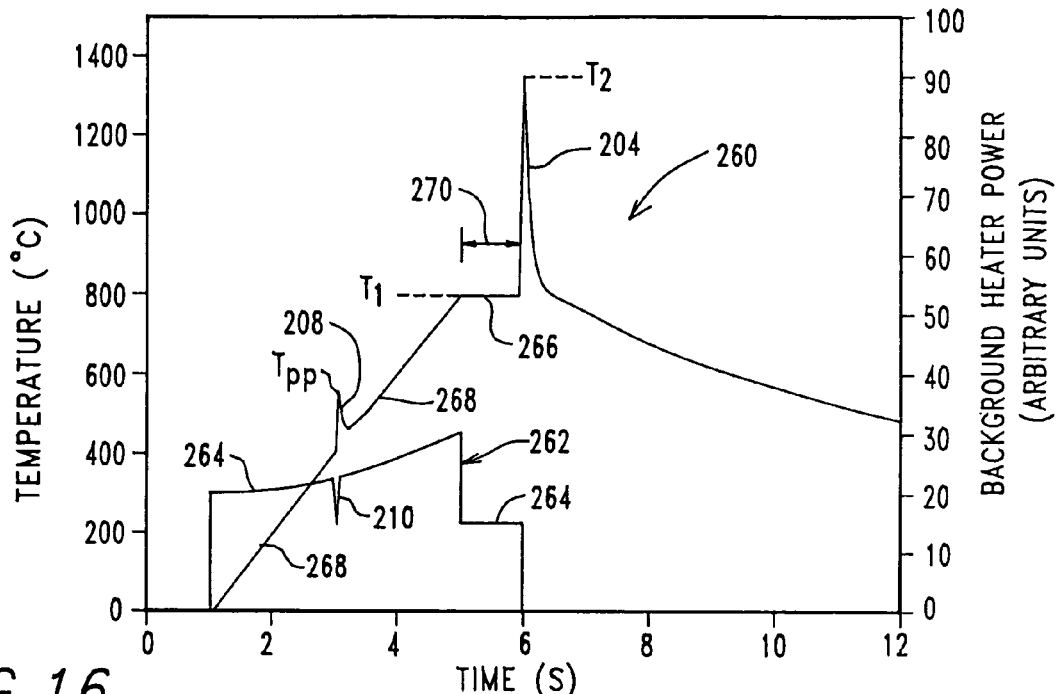
FIG. 16 is a plot illustrating a heating profile, performed in accordance with the present invention which, like the heating profiles of FIGS. 12 and 15, includes a pre-pulse followed by a treatment pulse, and which further illustrates a reduction in background heating with subsequent exposure of the substrate to a treatment pulse.

Like the heating profiles of FIGS. 12 and 15, a heating profile 260 of FIG. 16 includes a pre-pulse followed by a treatment pulse and therefore provides similar advantages. The FIG. 16 implementation differs, however, for the reason that a background heating power interval 262 includes a reduced power step 264, responsive to the wafer reaching $T_1$, which initiates a steady state interval 266. A treatment pulse is applied within a specified interval 270 of reaching $T_1$ so as to produce treatment spike 204.

As mentioned above, a pre-pulse may be applied for measurement purposes alone. Alternatively, a pre-pulse may be applied in a way which partially brings about a desired treatment result in the treatment object, in addition to being used for measurement purposes. In this regard, it should be appreciated that the concept of a pre-pulse is highly flexible in the context of a series of pulses to be applied to a substrate or other such treatment object. For example, the first pulse of a series of treatment pulses may be used as a pre-pulse by virtue of obtaining a measure of temperature rise induced by that first pulse. Pulse parameters of one or more subsequent ones of the pulses within the series of pulses may then be adjusted in view of that induced temperature rise.

Figure 17:
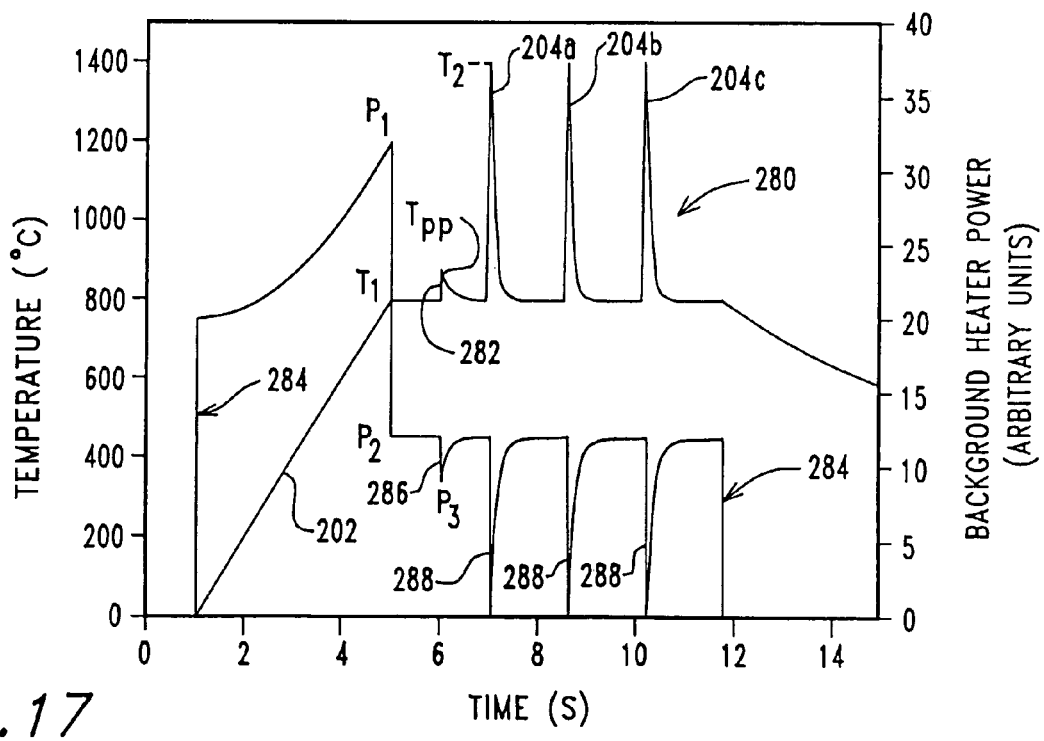
FIG. 17 is a plot illustrating a heating profile, performed in accordance with the present invention which, includes the highly advantageous use of a series of additional pulses following a pre-pulse.

Turning now to FIG. 17, a heating profile 280 is illustrated which is produced by a pre-pulse that is followed by a series of additional pulses. Resultant treatment heat spikes are indicated by the reference numbers 204a-c. Constant slope ramp-up interval 202 is produced by increasing background heating power to a level indicated as $P_1$ at the time that the substrate reaches temperature $T_1$. A pre-pulse heat spike 282 is produced responsive to reaching $T_1$ during a steady state interval, thereby causing the substrate temperature to momentarily increase to $T_2$, prior to the series of additional pulses. First additional pulse 204a is then applied in timed relation to the substrate returning to temperature $T_1$, following the pre-pulse. Thereafter, pulses 204b and 204c are applied at equal increments in time following pulse 204a, however, this is not a requirement. The increment separating these pulses is determined, at least in part, to permit the substrate to return to temperature $T_1$. A background heating profile 284 is used to control background heating in timed relation to application of the pre-pulse and subsequent series of treatment pulses.

Background heating profile 284 includes a negative going pulse 286 that is applied in timed relation to the pre-pulse and reduces the background heating power to a level designated as $P_3$. Further, a negative going pulse 288 is provided in the background heating profile responsive to each treatment pulse 204a-c. It should be appreciated that each of the treatment pulses 204a-c may be applied in accordance with the teachings above such as, for example, based on a predicted response of the substrate. Moreover, the additional pulses may be configured to produce a target condition in the substrate in any number of different ways. That is, each pulse, including the pre-pulse, may at least partially produce a target condition to the same degree or to a varying degree. It is also important to understand that the pulse parameters of the additional pulses may vary from pulse to pulse, as described above. For any series of pulses, measurements may be performed between the additional pulses to monitor any suitable physical characteristic wherein different parameters may be monitored at different times during the series of additional pulses. For example, pulse parameters, following application of pulse 204a, may be determined by a measurement of an optical characteristic, rather than a temperature response of the substrate. This feature may be particularly useful following the last pulse of a series wherein the system may initiate additional pulses based on some target value of the optical characteristic. As also described above, an optical characteristic may be monitored in parallel with temperature response monitoring. It is emphasized that a great deal of flexibility is provided by the disclosed features.

Figure 18:
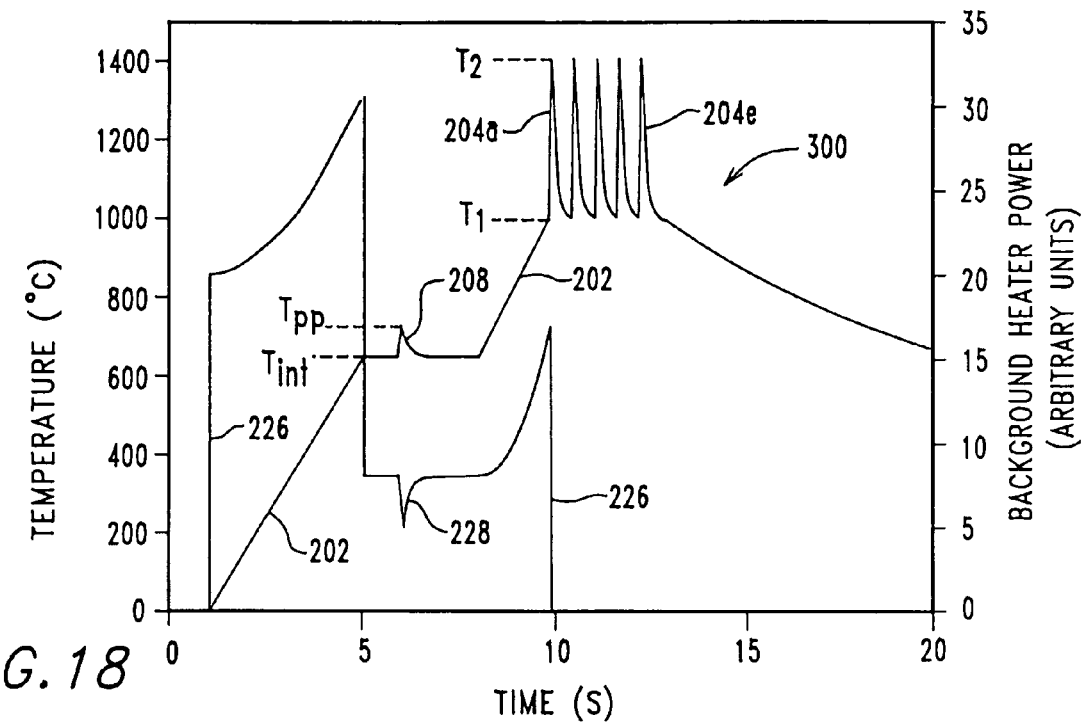
FIG. 18 is a plot illustrating a heating profile, performed in accordance with the present invention which, illustrates another implementation using a series of treatment pulses wherein the pre-pulse is applied during a ramp-up interval.

Referring to FIG. 18, another implementation is illustrated wherein a series of additional treatment pulses 204a-e form part of a heating profile 300 which shares the advantages of profile 280 of FIG. 17. In this example, background heating profile 226 of FIG. 13 is utilized, as described above. The series of treatment pulses is initiated in a suitable manner responsive to the substrate reaching $T_1$. In this example, however, background heating is terminated in timed relation to initiating the series of additional pulses using pulse 204a. Subsequently, each of pulses 204b-c are applied to the first surface upon its returning to temperature $T_1$. Again, the series of additional pulses is configured to cooperatively transform the substrate to its target condition and characteristics of the substrate may be monitored in any suitable manner, consistent with the teachings herein. Further, the additional pulses are repeated at a frequency which serves to obviate any need for background heating during the pulse series.

Implementations of heating profiles have thus far illustrated the use of a single pre-pulse, however, there is no limit to the number of pre-pulses which may be utilized in treating each substrate. Moreover, as described, any pulse may serve two functions: (1) as a pre-pulse by performing a temperature response measurement following that pulse and (2) as a treatment pulse.

Figure 19:
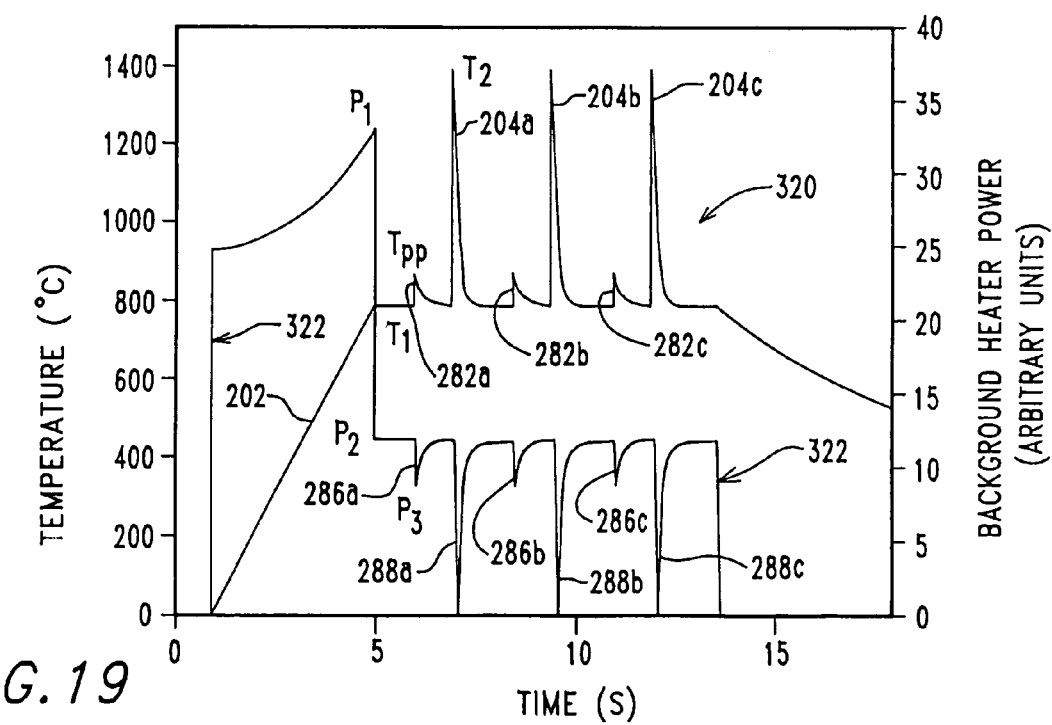
FIG. 19 is a plot illustrating a heating profile, performed in accordance with the present invention which illustrates another implementation using a plurality of pre-pulses wherein a pre-pulse precedes a treatment pulse within an overall series of pulses.

FIG. 19 illustrates a heating profile 320 which utilizes a pre-pulse prior to each one of a series of treatment pulses. Profile 320 is identical to profile 280 of FIG. 17, up to the conclusion of a first treatment pulse 204a. Thereafter, however, pre-pulses 282b and 282c are inserted prior to treatment pulses 204b and 204c, respectively, for measurement purposes. This configuration provides for precise tracking of the target condition in the substrate. In accordance with the present invention, a background heating profile 322 is controlled in timed relation to the interspersed series of pre-pulses and pulses, having negative pre-pulse spikes 286a-c associated with pre-pulse heat spikes 282a-c, respectively, and negative heat spikes 288a-c associated with treatment pulse heat spikes 204a-c.

Figure 20:
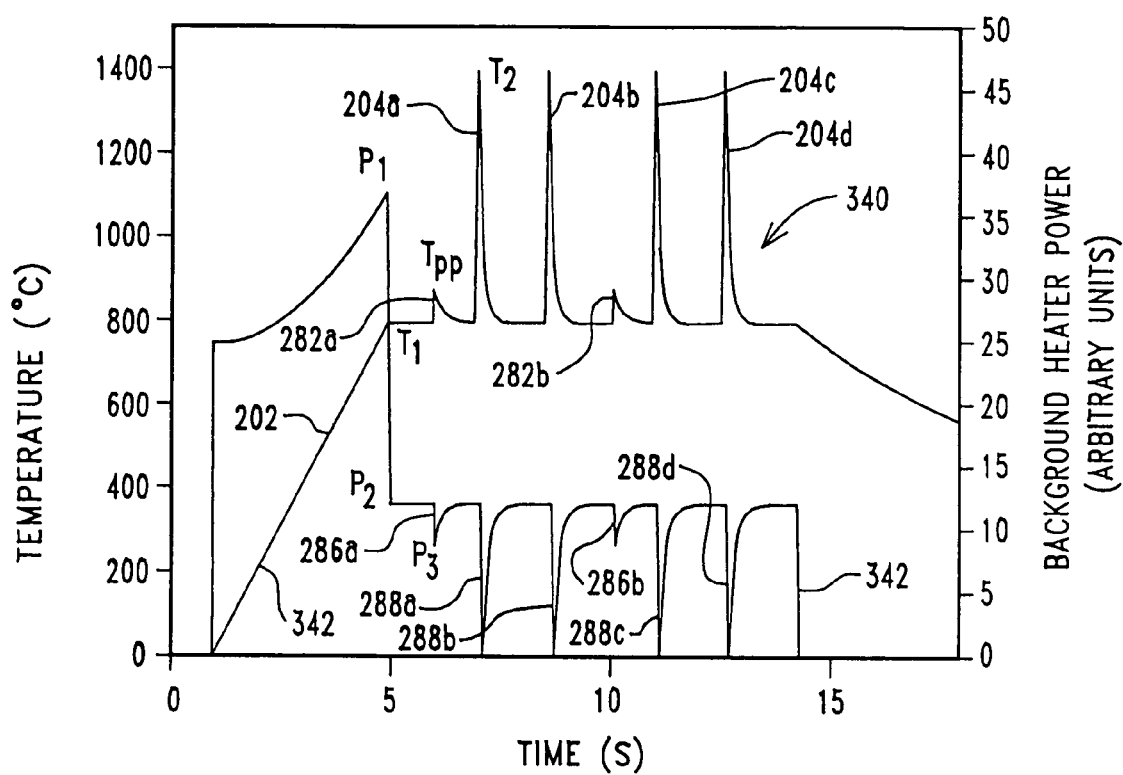
FIG. 20 is a plot illustrating a heating profile, performed in accordance with the present invention which, illustrates another implementation using a plurality of pre-pulses wherein a series of treatment pulses is utilized between successive ones of the pre-pulses.

Referring now to FIG. 20, a heating profile 340 is illustrated which utilizes intermittently interspersed pre-pulses. A background power heating profile 342 cooperates with pulse heating to produce profile 340. The latter is identical to profile 320 of FIG. 19, with the exception that a series of pulses is present between successive pre-pulses while background heating profile 342 is similarly identical to background heating profile 322 of FIG. 19. Detailed discussions of like features of profiles 340 and 342, therefore, will not be repeated for purposes of brevity. With regard to the use of a series of treatment pulses between successive ones of the pre-pulses, it is noted that all of the teachings herein with regard to the use of a pulse series are equally applicable in the context of FIG. 20.

It is noted that pulse series may have been illustrated in the figures including pulses which appear to be identical, it is to be understood that this is not a requirement and that parameters of individual pulses may be adjusted in any suitable manner in order to accomplish treatment objectives.

The present invention contemplates the use of scanning energy sources as alternatives to pulsed energy sources., That is, a pulse of energy may be delivered to each location on the wafer in a sequential manner by scanning a beam of energy over the surface, such as, for example, by using a laser beam. The energy beam need not be pulsed itself and continuous wave (CW) sources can be used, if so desired. In this scanning mode, the effective pulse duration may be thought of as being related to the size of the energy beam divided by the scan velocity. The energy beam can be scanned over the surface in a pattern that gives full coverage of the wafer, for example, by raster scanning. If so desired, several scans can be overlapped to improve the uniformity of processing, or to extend the processing time at any one location (the latter is the equivalent of applying multiple pulses). Another approach that can be useful is to form the energy source into a line shape and sweep the line shape across the wafer. If the line shape includes a length that is shorter than the wafer diameter, multiple sweeps can be used to obtain coverage of the whole wafer. Of course, multiple sweeps can be performed at any selected location or locations on the wafer to increase the effective processing time to a desired value. An energy beam that at least matches the diameter of the wafer may be advantageous, since the beam can be swept across the whole wafer in one pass, so as to at least potentially minimize processing time. In the context of this scanning approach, it is important to understand that the present invention contemplates the use of any form or source of energy which is adaptable for use in a scanning mode. For example, energy from arc lamps may be formed into a desired line or point shape. Moreover, electron beams and microwave (for instance, gyrotron) beams serve as other suitable energy forms.

One advantage arising from the scanning beam approach resides in the fact that, by making the beam size rather small, a very high temperature rise is produced at the surface of the wafer without needing to deliver a very large energy pulse. Although the processing time for processing a complete wafer increases, relative to the case where pulsed energy is simultaneously delivered to the whole wafer, the hardware for delivering the energy may be smaller and more cost effective.

It is noted that the scanned processing mode can be usefully combined with background heating. Such background heating serves the purpose of reducing the power needed even further, and also serves to reduce thermal stress induced by the scanning energy source. Reducing the thermal stress, in turn, reduces the possibilities of wafer breakage or introduction of defects from excessive stress. A background heating thermal spike, as introduced in FIG. 8 and seen in other ones of the various figures, may be used in the scanning mode, for example, by sweeping a line of energy across the complete wafer. Such a implementation may be especially attractive since, in this case, the processing time can be minimized with benefits of lower thermal budget and of higher wafer throughput. A heating cycle can be designed wherein the energy sweep is performed when the wafer reaches a chosen temperature, and the concept of controlling scanning sweep and background heating in timed relation is useful here. However, since a sweep normally takes longer than the millisecond duration pulses normally considered in the pulse-heating mode, the wafer temperature may stay at a fixed temperature for a period which corresponds to the scan duration, for example, corresponding to a time period of at least 0.5 s while the energy beam is scanned across the wafer surface.

The highly advantageous use of a pre-pulse, as taught in the foregoing discussions, enjoys still further applicability in the realm of a scanning mode implementation. For example, the energy source can be scanned over the surface of the treatment object and its effect is monitored by one of the several methods previously considered for the pulsed heating mode. The pre-pulse can be performed using the same power level, beam size and scanning velocity as a processing energy application, or any of these parameters can be changed for the pre-pulse, for example, to ensure that the pre-pulse does not process the wafer, and serves only a measurement purpose.

In one pre-pulse scanning mode implementation, an optical sensor is used to sense the temperature rise induced by the scanned beam at the surface where the beam impinges on the wafer.

Alternatively, the sweep may be performed over the surface with subsequent measuring of the temperature attained on the wafer (i.e., after the sweep concludes). This latter type of measurement can be performed either on the front or the back surface. However, in this case, it is important to realize that the time taken to deliver the energy may be significantly longer than that required in the pulsed heating mode wherein the pulse is simultaneously delivered to the whole wafer surface, and that it is not necessarily delivered in a spatially homogeneous manner. At any given moment, there will be a large lateral temperature gradient on the surface of the wafer, as a consequence of the scanning action of the beam, combined with its relatively small size (relative to the wafer size). One way to handle this concern is to increase the scan velocity during the pre-pulse. This serves two useful purposes. Firstly, it allows the energy delivered at any one location to be lower and, as a result, the temperature rise at each location is lower. Consistent therewith, the pre-pulse does not produce an undesired change in the state of the wafer. Secondly, increasing the scan velocity means that the energy is delivered to the whole of the scanned region in a shorter time. Accordingly, there is less time for that energy to be lost from the wafer surface (for example, by radiation) during the scan and, as a result, the measurement of the wafer temperature rise at the end of the scan is closely linked to the energy delivered during the scan, thereby allowing a more accurate estimate of the power coupling and hence a more reliable prediction of the processing conditions needed for obtaining the desired result.

A third way to use the pre-pulse concept in the scanned processing mode is to scan the energy beam across the wafer surface and to sense reflected and/or transmitted radiation during the scan. The measured reflected and transmitted energies can be used to deduce how much energy is absorbed in the wafer and to adjust processing conditions accordingly.

Any of the foregoing approaches can be used to adjust processing parameters such as, for example, the power of the energy beam, the scan velocity, the beam size or shape. The background heating can also be adjusted.

In the scanned mode of processing, a more sophisticated correction may be performed wherein the processing parameters are adjusted with respect to the position of the scanning energy source on the wafer. This implementation can be useful in cases where the wafer is patterned and different parts of the wafer have different physical characteristics. For example, if a sensor such as an infra-red camera is used to observe the wafer surface during processing, then the observation results may be used to deduce the spatial distribution of the temperature rise induced by the heating beam during the pre-pulse scan. By forming a map of the temperature rise induced, an a priori correction can be applied to the processing conditions, providing for the production of still more uniform temperature rises across the entire wafer. Of course, such a system can be used during processing itself to provide real-time feedback to the energy source, even through control issues may mandate close monitoring to assure desired results.

A similar approach to spatial control of processing conditions can be applied by using a camera to observe reflected or transmitted light from a wafer. In this case, it is contemplated that desired information may be obtained by illuminating the wafer with energy that is spectrally similar to that of the processing energy source, even if it is not literally the same energy source. For example, a low power light source can be used to illuminate the wafer prior to processing. However, there are some advantages to sensing the energy reflected or transmitted by the processing beam itself. For example, the geometric illumination conditions are identical to those used in the processing mode, so the information is more representative of actual conditions. Once again, a pre-pulse approach can be useful in that it can collect the required information without exposing the wafer to excessive processing.

The present invention is considered to be highly advantageous with regard to annealing ion-implantation damage on a time scale sufficiently short to eliminate undesirable diffusion effects, while permitting the use of very high temperatures to eliminate defects and activate dopants. It is to be understood that the very high heating-rate and cooling rate, combined with the extremely short duration of the high-temperature anneal, permits access to new regimes for optimization of the annealing of ion implants. In this regard, several exemplary aspects of the present invention are attractive:

(a) Elimination of transient-enhanced diffusion (TED): One attractive application resides in the annealing of implants which are normally affected by TED during conventional RTP, including even the most aggressive "spike anneals". It has been suggested that ultra-high heating rates can be used to minimize the effects of TED and a pulsed heating regime can meet the necessary requirements for heating and cooling rate as well as delivering the extremely high peak temperature needed to eliminate the defects responsible for TED.

(b) Maximization of dopant activation and minimizing dopant diffusion: One of the major challenges for scaling devices down lies in the creation of shallow junctions with sufficiently high electrical activation. Most conventional processing, including spike-anneal RTP, have difficulty producing electrical carrier concentrations much above $10^{20}/cm^3$, even though the implanted dopant concentration can be far higher. This limit can lead to an undesirably high resistance through the source and drain regions of the MOS device. The limit is thought to be linked to the solid-solubility limit for the dopants at the anneal temperature. By applying the pulsed-anneal method, it is possible to achieve higher dopant activation by using anneals that produce peak temperatures that are significantly higher than those that are practical for conventional RTP and where the solid-solubility of dopants is significantly greater. For example, it would be very difficult to anneal a wafer in an isothermal mode at temperatures greater than 1150° C. without introducing excessive dopant diffusion, surface damage and stress-related defects such as slip, whereas exposure to these temperatures for less than 10 ms is unlikely to cause these undesirable side-effects while still allowing dopant activation to take place. In particular, for implant energies that are so low that TED is not a significant factor in determining the diffusion, the minimum junction depth can be achieved by using the shortest heating cycle possible that can achieve the desired degree of dopant activation and damage annealing. This suggests the use of the highest temperature possible, the shortest heating and cooling times, and the minimum dwell time at the peak temperature. Pulsed-heating meets all of these requirements, since the heat-up time is very short. Because of the very high energy density delivered to the wafer surface, the cool-down is very fast, since thermal conduction provides a very fast mechanism for removing heat from the wafer surface into the bulk of the wafer. Moreover, the dwell time is sort because the pulsed lamps have a very fast dynamic response.

It is contemplated that the present invention will be found to be particularly effective when combined with low-energy ion implants using, for example, the following species and approximate energies: B with energy (E)<2 keV; $BF_2$ with E<5 keV; As with E<8 keV and P with E<4 keV. The combination of the implantation of Ge or Si ions for preamophization with B-doping is also likely to work well. Typically the Ge ion implant would be with an energy in the range between 2 and 10 keV and the dose would be $\sim 10^{15}/cm^2$. The preamorphization approach could also be useful with the P implants.

One concept which is expected to be useful involves using a low temperature anneal to recrystallize an amorphous silicon film, created during an ion implantation process, and then applying a high temperature pulse. This may have some benefits over a single stage anneal, because a high temperature anneal of an amorphous layer can lead to polycrystal formation, which may be undesirable. An alternative would be to perform one pulse anneal (with a relatively low peak temperature <~1000° C.) that crystallizes the film, followed by a second pulsed process with a rather high peak temperature (>1000° C.) that completes the annealing process. When an amorphous layer is formed during the implantation process, it has been observed that solid-phase epitaxial (SPE) crystallization of the film can result in very high electrical activation of the dopants even without further high temperature annealing. Such processes can be carried out at temperatures as low as 500° C. One problem that has been observed is that the presence of high concentrations of impurities, such as the implanted dopants themselves, can reduce the crystallization process growth rate and this reduction in growth rate is associated with the formation of defect structures. The phenomenon is reduced as the process temperature rises, but in conventional RTP systems, the limited heating rate possible (<500° C./s) means that most implanted films will crystallize before the wafer can reach a temperature of 800° C. As a result, it is very difficult to perform an SPE process at a temperature above 800° C. A pulsed heating approach allows SPE processes to be conducted at any desired temperature including even higher temperatures, such as 900° C., where regrowth is not affected so much by the doping effects.

Another concern arises due to the presence of defects in the part of the wafer beyond the amorphous layer. These defects may not be annealed out by a low temperature SPE process, and they can cause problems in device structures, including introduction of excessive p-n junction leakage. As a solution, the solid-phase crystallization processes may be performed at higher temperatures to simultaneously reduce the effects of these defects while still activating the dopants. It may also be desirable to combine relatively low temperature crystallization processes with pulsed anneals, where the pulsed anneal can affect the defects and the SPE process can activate the dopants. This benefit is at least potentially obtained by performing a high temperature pulsed anneal before or after the SPE process, through suitable adjustment of the pulse parameters.

(c) Performing source/drain anneal after formation of high-K dielectric films: As device dimensions are being scaled down, it has become clear that it will be important to replace the conventional silicon dioxide gate insulator with a material with a higher dielectric constant. Several materials have been proposed, but one significant problem arises in that they are often not thermally stable and may not survive the anneal required to activate the source/drain implants. This may lead to alternative manufacturing schemes, such as the "replacement gate" method, but such departures from conventional sequence of fabrication are undesirable. One method to avoid this change is to perform the source/drain anneal in a manner that permits effective annealing and dopant activation without degrading the qualities of the gate dielectric. The pulsed-anneal method of the present invention is considered as advantageous here, since the thermal process for annealing can be performed in a time which is so short that there is no opportunity for the dielectric to undergo an undesirable reaction or crystalline transformation. This allows the gate material to be formed before the source-drain implants are performed, simplifying the process. The pulsed anneal can be performed on wafers where gate or capacitor structures including materials such as, but not limited to Zr or Hf oxides, silicates or aluminates, titanium oxide, tantalum pentoxide, aluminium oxide, lanthanum oxide, ytterbium oxide, Barium Strontium Titanate or other high-K materials.

(d) Facilitating delivery of dopants from gas-phase species: It is possible to deposit dopant species on a wafer surface by decomposing gas-phase compounds such as $B_2H6$, $PH_3$ or $AsH_3$. This approach can, in principle, dispense with the need for ion-implantation. After the dopant species are deposited on the wafer surface, a high energy pulse is used to either melt the surface or to drive-in the dopant via solid-state diffusion. This approach has been proposed with pulsed-laser treatments, but it is also possible to carry out such a process using a pulsed lamp approach. In fact there may be certain associated advantages. For example, the decomposition of the compounds requires them to be exposed to uv radiation, which can be obtained from a pulsed lamp. Alternatively an excimer lamp or laser can be used to generate the uv light needed to decompose the species, and the pulsed lamp can be used for the thermal process.

As a broad category, the present invention is considered to enjoy applicability when employed in the field of dielectric films for gates and capacitors. In this regard, several exemplary aspects of the present invention are attractive:

(a) Pulse-by-pulse growth of thin oxide films: Pulsed heating presents the opportunity to grow silicon dioxide films at temperatures greatly higher than possible in conventional schemes, both in dry oxygen and in an ambient containing steam. Because oxide films formed at higher temperatures can display better electrical qualities, for example, as a result of the ability for the oxide film to undergo stress relaxation, it may be beneficial to prepare very thin oxide interface layers by exposing wafers to pulsed-heating. This could be achieved in a number of ambients, including, but not limited to oxygen, NO, $N_2O$, and ambients with steam. The pulsed method, as taught herein, provides tight process control on thin film growth despite fast reaction rates, while minimizing the thermal budget.

(b) Nitrogen incorporation in thin oxides: The ability to expose oxide films to gases containing nitrogen (especially $NH_3$, NO and $N_2O$) can allow nitridation of the oxide film, which has been shown to be beneficial for MOS devices. The ability to use high temperatures can improve the efficiency of nitrogen incorporation without introducing excessive thermal budget. The ability to keep most of the gas in the reaction chamber relatively cool while selectively heating the wafer surface also offers opportunity for processes where gas-phase chemistry is thought to be involved. For example, by heating the wafer, and keeping the gas phase relatively cool, processes such as $N_2O$ oxidation may occur in a different manner.

(c) Nitridation of silicon: Normally, silicon reacts very slowly with $N_2$ or with $NH_3$. By using pulsed heating, very high temperatures can be generated at the surface of the silicon to permit the direct formation of thin films of silicon nitride or silicon oxynitrides.

(d) High-K materials anneals: Many of the new materials proposed for dielectrics require anneals to improve their stoichiometry. However, these anneals have to be performed in a manner that does not introduce excessive thermal budget, does not lead to excessive growth of silicon oxide and does not cause reactions or crystallization of the high-K material. A pulsed approach can allow higher temperature processing that may be useful for these anneals.

(e) Surface preparation: Short pulses of energy may be suitable for preparing surfaces, for instance, prior to the formation of thin dielectric coatings. For example, one well known technique for cleaning silicon surfaces is to flash heat them to >1200° C. This would be impractical in normal wafer processing since a long (greater than one second) cycle above 1200° C. would be likely to introduce defects, diffusion and surface damage. On the other hand, the short duration of a pulsed cycle performed in accordance with the present invention, avoids these deleterious effects. Likewise, other surface preparation methods could use the pulse heating to assist in the removal of organic materials from the wafer surface, or with removal of metallic impurities. For organic materials, the combination of the heat treatment with oxygen or ozone could be beneficial. For metallic impurities, the combination with halogen-bearing compounds could be useful. In these surface preparation approaches, it may be useful to use the full spectrum of light from the pulsed lamp, which can include a substantial amount of UV radiation. The UV radiation can be useful in generation of ozone and oxygen radicals from oxygen-bearing gases, and in generation of halogen radicals from halogen-bearing species.

As still another broad category, the present invention is considered to enjoy applicability when employed in the field of silicide processing and formation. In this regard, several exemplary aspects of the present invention are attractive:

Titanium silicide formation: There is a problem with the use of Ti silicide in advanced device structures, because the C49 phase of the material has difficulty converting to the desired C54 phase when it is in the form of a narrow line. It has been reported that fast heating rates can help with this problem, and in this context the very high heating rates and peak temperatures possible in a pulsed-heating scheme may provide a way around this problem.

Silicide processing issues: Generally, benefits of pulsed processing are expected in formation of titanium, cobalt, nickel and platinum silicide films. For example, the reaction of the metals with silicon or even with other materials such as Ge or SiGe can be enhanced by elevating the temperature but decreasing the time taken for the process. These approaches will affect the nucleation and growth of grains, giving increased flexibility of processing. Pulse heating presents several interesting advantages for processing silicide (and indeed other metal or metal-compound) films:

The pulse-lamp spectrum is at shorter wavelengths than conventional W-halogen lamps, and will couple more effectively to metallized surfaces, which are usually more reflective at longer wavelengths.

The low background temperature and very short exposure to high temperature may decrease the effect of oxygen or water vapor contamination on the process.

The low background temperature facilitated by the present invention is thought to radically better throughput, through the elimination of much of the ramp-up & cool-down time for a wafer. The cool-down aspect is especially important, since the risk of reaction of the metal film and oxygen or water vapor impurities during wafer unloading can be minimized.

As still another broad category, the present invention is considered to be advantageous when used with copper films. In this regard, several exemplary aspects of the present invention are attractive:

In the annealing of copper films, process requirements do not seem too critical in terms of temperature control, but issues relating to throughput and cost are paramount. Pulse-processing may completely change the throughput limitations of RTP, where traditionally the throughput has been strongly affected by heating and especially cooling rates which are strongly affected by the thermal mass of the wafer. The advantages listed in the foregoing discussions with reference to silicides are also especially relevant to Cu film processing.

It is also possible to use a thermal pulse to assist with reflow of copper deposited on a wafer. This process can be used to fill trenches with copper that has been deposited, for example via a sputtering process. The pulse of energy can help the copper diffusion to fill the trench, or it can even cause the copper film to melt and flow into the trench. The short duration of the pulse allows the process to take place at the wafer surface without introducing excessive thermal exposure which could damage other materials present or cause undesired dopant diffusion.

As another broad category, the present invention is considered to enjoy applicability when employed in the field of chemical vapor deposition. A combination is contemplated of the pulse method of the present invention with the deposition of films by chemical vapor deposition (CVD) methods. Here, the use of a pulse approach presents some motivating possibilities. For example, the wafer temperature could be kept at a much lower temperature, reducing heat build-up in other parts of the system, such as quartzware, slip-free rings or showerheads. These components would remain cool and be less susceptible to build up of contaminants by parasitic CVD deposition. The use of short high temperature cycles might also allow new opportunities for varying the growth rates and microstructure of the films. It could also alter the aspects related to gas phase or surface nucleation, for example by keeping the gas phase cooler, it may be possible to decrease the formation of particles in the gas phase. There are also improved possibilities for process control. For example, the in situ sensors can detect the amount of film grown on the substrate during or even after a pulse of energy has been applied, and the process conditions can be altered so that the next pulse leads to a desired effect in terms of film growth. This feedback can be used to adjust factors such as the pulse duration, shape energy or time interval, or the "background heating" conditions, or even other factors such as gas flows, chamber pressure, etc. Another concept in the CVD context is to use the temperature pulses to control the incorporation of dopants or other impurities into the growing film. The very short exposure to high temperatures might allow new possibilities in terms of producing abrupt or shaped doping profiles.

CVD applications can cover a wide spectrum of cases, including, for example, the deposition of silicon, silicon dioxide, silicon nitride, as well as high and low-K materials, metals and metal compounds.

Other annealing processes can also benefit from the use of the present invention. For example, the pulsed technique can be applied to a whole range of annealing processes, including annealing of deposited films for stress or microstructure control or for "curing" purposes. The latter may be useful for low-K films.

It is further recognized in the context of the present invention that adjustment of the background temperature may used to improve repeatability from wafer-to-wafer as well as within-wafer uniformity. Adjustments can be made on the basis of in situ measurements of the effect of the pulse, by using sensors that observe the effect of pulsed heating on the wafer, or adjustments can be made by evaluating process results on wafers and making subsequent adjustments in the background heating conditions to improve repeatability and/or uniformity.

For example, if it is found that pulse processing conditions result in process temperatures that are too high, the background heating temperature can be reduced so that subsequent pulses result in lower peak temperatures, thereby serving as an alternative to altering the heating pulse conditions. Further, background heating conditions can be changed between wafers or even during processing of an individual wafer. For example, if a pre-pulse is applied and its effects analyzed by any suitable method, including those described herein, background heating temperature may be changed in timed relation, such as prior to applying the processing pulse. A similar approach can be used in any multi-pulse processing recipe.

In some cases, for example, as a result of different surface coatings on different wafers, results on different wafers will vary. In this instance, background heating temperature may be adjusted to compensate for the variations in the effects of the pulses. The appropriate change in temperature can be assessed, for example, by evaluating process results on wafers after they have been processed, or through in situ measurements from sensors that observe the effect of heating on the wafer, while it is in the processing chamber.

Within-wafer uniformity can also be adjusted using this type of approach. For example, if it is found that parts of the wafer are processed too hot, for instance, as a result of a non-uniform distribution of pulse heating energy across the surface of the wafer, the background heating conditions can be changed so that the induced background temperature is lower in those parts of the wafer. When the pulse is then applied, the non-uniform background temperature compensates for the non-uniform pulse heating and uniform process results are achieved. Non-uniform background heating can be achieved in any suitable manner such as, for example, by heating the wafer with an array of background heating lamps and adjusting the power levels to individual lamps within the array to achieve a desired temperature profile across the wafer.

It should also be noted that uniformity on a wafer can also be adjusted by applying non-uniform pulse heating to the wafer surface. For example, if the pulse heating is applied from a bank of lamps that are operated in the pulsed mode, then the energy delivered to each lamp can be adjusted to change the spatial distribution of pulsed energy across the wafer surface. Adjustments can be made on the basis of process results measured on wafers after processing, or through the use of sensors within the processing system that observe the effect of the pulse at multiple locations across the wafer surface. An imaging system or camera can also be used to provide the information about the spatial distribution of the temperature rise induced by the pulse on the wafer. Of course, non-uniform background heating may be used in combination with pulse energy application that is designed to deliberately induce non-uniform heating results.

In terms of uniformity optimization, a pre-pulse approach is considered as useful, especially if multiple sensors or an imaging system is used to monitor the temperature distribution induced on the wafer by the pulse. The information can be used to adjust process uniformity by changing the background heating distribution or the pulse energy distribution to achieve process uniformity in the next pulse.

Clearly similar concepts can be used to improve process uniformity in the case where energy is delivered by a scanned energy source. Once again, either the background heating, or the beam parameters for the scanned energy source can be adjusted to obtain improved repeatability and uniformity.

Another approach can involve using a pulsed energy source to deliver pulses of energy to selected areas of the wafer in a sequential manner. This can provide advantages because the energy source does not have to deliver as large an amount of energy as if the whole wafer is irradiated with one pulse simultaneously. Accordingly, a smaller and lower cost power supply can be used. Coverage of the whole wafer can be obtained by moving the wafer with respect to the energy source (or vice versa) between pulses. In this mode of operation, once again, the pre-pulse concepts can be applied to each region of the wafer in turn. Likewise, uniformity can be optimized by matching the process conditions for each region irradiated. This can be advantageous, especially if multiple sensors or an imaging system are not available. For example, if the pulse energy source only irradiates part of the wafer, a sensor can observe the thermal response at that area. Then the wafer can be translated relative to the energy source and the sensor so that another area is exposed, and once again the sensor can monitor the process. In this way, the whole wafer can be processed while still monitoring process conditions, but using only one sensor. Such a configuration may be produced at lower cost and may provide advantages arising as a result of its simplicity in comparison to a multi-sensor system or an imaging system.

If desired, in systems where the pulsed energy source does not irradiate the whole wafer in one go, it is desirable to overlap the regions that are exposed to improve the uniformity of coverage. Such overlapping should be accomplished in a way that leads to uniform process results and may be implemented in one manner by optimizing the degree of overlap of pulses, for example, by evaluating process results on processed wafers and then changing the amount of wafer (or energy source) movement that occurs between pulses.

It is important to understand that all of the foregoing concepts relating to multiple-pulse exposures of a portion of the wafer surface are equally applicable to the use of scanning energy sources.

Insofar as non-semiconductor applications, the present invention may readily be used in non-semiconductor materials processing in view of this overall disclosure. For example, the present invention can be applied to processing of magnetic materials or used under any circumstances wherein fast heating or fast quenching lead to desirable properties and/or results.

Having described the present invention in detail, it is worthwhile to again consider certain aspects of the prior art. Specifically, prior art pulse mode heating implementations have failed to recognize the inadequacy of thermostatic temperature monitoring in a pulsed mode setting. As described above, thermostatic monitoring innately provides an "after-the-fact" response when used as a sole control mechanism in a pulsed mode heating system. This problem arises due to the very nature of pulsed heating since pulse parameters are generally determined in advance. Such a pulse then delivers a large amount of energy in a very short interval and there is no opportunity to control heating by a pulse once the pulse has been triggered or fired. Accordingly, prior art references such as Logan, described above, are submitted to be inadequate in the realm of practical pulsed mode heating.

The present invention is considered to resolve this problem in a number of highly advantageous ways which incorporate features such as, for example, timed relational control and the use of a pre-pulse or other such test pulse for which subsequent treatment is based on a "processing time" or run time empirical result. These features may be used alone or in combination. These features are further considered to provide remarkable and sweeping advantages over the prior art, particularly with regard to process repeatability. That is, the present invention provides consistent results, irrespective of substrate to substrate variations or virtually any relevant physical property which may vary from one substrate or treatment object to the next.

It should be appreciated that the present invention enjoys applicability with respect to treating sets of objects such as, for example, semiconductor wafers. For instance, a first wafer may be employed as a test wafer wherein a set of treatment parameters may be developed using any suitable combination of the various features that are brought to light herein. Thereafter, treatment of subsequent wafers may be based upon that set of treatment parameters which, of course, may be further fine-tuned on a wafer by wafer basis.

Inasmuch as the arrangements and associated methods disclosed herein may be provided in a variety of different configurations and modified in an unlimited number of different ways, it should be understood that the present invention may be embodied in many other specific forms without departing from the spirit or scope of the invention. Therefore, the present examples and methods are to be considered as illustrative and not restrictive, and the invention is not to be limited to the details given herein, but may be modified within the scope of the appended claims.

What is claimed is:

1. A method for processing a semiconductor substrate, said substrate including first and second opposing surfaces, said method comprising the steps of:
inducing a temperature rise in said semiconductor substrate by exposing the substrate to an energy pulse characterized by a set of pulse parameters;
sensing the temperature rise of the semiconductor substrate; and
based on said temperature rise in combination with said set of pulse parameters, determining an absorptivity of the semiconductor substrate.

2. The method of claim 1 further comprising the step of using the absorptivity, as determined, as a value in establishing a set of treatment parameters for continuing treatment of said semiconductor substrate.

3. The method of claim 1 further comprising the steps of:
using said absorptivity to establish a set of treatment parameters for at least one additional energy pulse; and
exposing said semiconductor substrate to said additional energy pulse based on said set of treatment parameters.

4. The method of claim 3 including the step of exposing the first surface to said energy pulse using a particular geometric arrangement and wherein the step of exposing the first surface to said additional energy pulse uses said particular geometric arrangement.

5. The method of claim 3 wherein said energy pulse includes a power level that is lower than a treatment power level of the additional energy pulse.

6. The method of claim 5 wherein said energy pulse is configured in a way which produces a negligible change in said semiconductor substrate with respect to a target condition such that the energy pulse is applied for a measurement purpose.

7. The method of claim 5 wherein said energy pulse is applied to at least partially transform said semiconductor substrate to said target condition.

8. The method of claim 4 including the step of emitting said first and second pulses from one radiation source such that the first and second energy pulses are incident on the semiconductor substrate in an angularly identical way.

9. The method of claim 1 wherein a selected one of said first surface and said second surface is exposed to said energy pulse and said temperature rise is sensed at the selected one of said first surface and said second surface.

10. The method of claim 1 wherein a selected one of said first surface and said second surface is exposed to said energy pulse and said temperature rise is sensed at one of said first surface and said second surface which is opposite the selected surface.

11. A system for processing a semiconductor substrate, said substrate including first and second opposing surfaces, said system comprising:
heating means for inducing a temperature rise in said semiconductor substrate by exposing the substrate to an energy pulse characterized by a set of pulse parameters;
sensing means for sensing the temperature rise of the semiconductor substrate; and
processing means for determining an absorptivity of the semiconductor substrate based on said temperature rise in combination with said set of pulse parameters.

12. The system of claim 11 wherein said processing means is configured for using the absorptivity as a parameter in establishing a set of treatment parameters for use in completing processing of said semiconductor substrate.

13. The system of claim 11 wherein said processing means is configured for using said absorptivity to establish a set of treatment parameters for at least one additional energy pulse and for cooperating with the heating means to expose said semiconductor substrate to said additional energy pulse based on said set of treatment parameters.

14. The system of claim 13 wherein said heating means is configured for exposing the first surface to said energy pulse using a particular geometric arrangement and for exposing the first surface to said additional energy pulse using said particular geometric arrangement.

15. The system of claim 13 wherein said energy pulse includes a power level that is lower than a treatment power level of the additional energy pulse.

16. The system of claim 15 wherein said heating means and said processing means cooperate to emit said energy pulse in a way which produces a negligible change in said semiconductor substrate with respect to a target condition such that the energy pulse is applied for a measurement purpose.

17. The system of claim 15 wherein said energy pulse is applied to at least partially transform said semiconductor substrate to said target condition.

18. The system of claim 14 wherein said heating means includes a radiation source for emitting said first and second pulses such that the first and second energy pulses are incident on the semiconductor substrate in an angularly identical way.

19. The system of claim 11 wherein said heating means is configured for exposing a selected one of said first surface and said second surface to said energy pulse and said sensing means senses said temperature rise at the selected one of said first surface and said second surface.

20. The system of claim 11 wherein said heating means is configured for exposing a selected one of said first surface and said second surface to said energy pulse and said sensing means senses said temperature rise at the one of said first surface and said second surface which is opposite the selected surface.

21. A method for processing an object having opposing major surfaces including first and second surfaces, said method comprising:
performing a determination of at least one optical characteristic of said object;
applying heat to the object during a background heating mode, thereby selectively heating the object to at least generally produce a temperature rise throughout the object;
based at least on a determined value of said optical characteristic, establishing a set of pulse parameters for the application of a pulse of energy to said object; and
applying said pulse of energy, having said set of pulse parameters, to the first surface of said object and in cooperation with said temperature rise produced by the background heating mode.

22. The method of claim 21 including using a heated plate to apply said heat during the background heating mode.

23. The method of claim 22 including using an array of flash lamps to apply said pulse of energy.

24. The method of claim 21 wherein performing the determination of at least one optical characteristic includes establishing at least one of the following: (i) a reflectivity and (ii) an absorptivity of said object.

25. The method of claim 21 wherein performing the determination of at least one optical characteristic includes subjecting the object to a test pulse having a test pulse energy and, during the test pulse, collecting a set of pulse energy data using one or more optical sensors.

26. The method of claim 25 including arranging a first optical sensor for sensing a reflected portion of said test pulse energy.

27. The method of claim 26 including arranging a second optical sensor for sensing a transmitted portion of said test pulse energy and thereafter using the reflected portion and transmitted portion of the test pulse energy to determine an absorptivity of the object.

28. The method of claim 24 wherein said reflectivity is determined using a low power light energy to illuminate said object and, thereafter, observing the low power light energy that is reflected by said object responsive thereto, as said optical characteristic.

29. The method of claim 28 including producing said low power light energy such that the low power light energy is spectrally similar to the pulse of energy.

30. The method of claim 21 wherein the determination of the optical characteristic uses a low optical power so as to produce a negligible change in said object.

31. A method for processing an object, said method comprising:
performing a determination of at least one optical characteristic of said object based on an illumination that is spectrally characterized in a predetermined way;
selectively heating the object to at least generally produce a temperature rise throughout the object;
using at least a determined value of said optical characteristic, establishing a set of pulse parameters for the application of a pulse of energy; and
in cooperation with producing said temperature rise, using a processing energy source to apply said pulse, having said set of pulse parameters, to the object and incident on at least one surface of said object so as to produce a temperature profile which decreases through the object from said surface, and wherein said illumination is configured in said predetermined way so as to be spectrally similar to the pulse of energy.

32. The method of claim 31 wherein applying said pulse of energy includes using at least one lamp as said processing energy source to produce the pulse.

33. The method of claim 32 wherein said optical characteristic is a broadband object absorptivity with respect to said pulse of energy produced by said lamp.

34. The method of claim 33 including determining said optical characteristic by collecting data relating to a reflected energy from said wafer and using the collected data, at least in part, to establish said broadband object absorptivity.

35. The method of claim 32 wherein said optical characteristic is a broadband object reflectivity with respect to said pulse of energy produced by said lamp.

36. The method of claim 32 wherein said lamp produces a particular spectrum of light and that particular spectrum of light is incident on said object.

37. The method of claim 32 including using an arc lamp as said lamp.

38. The method of claim 32 including using a flash lamp as said lamp.

39. The method of claim 31 wherein applying said pulse of energy includes using an array of lamps as said processing energy source to produce the pulse.

40. The method of claim 39 wherein said array of lamps produces a particular spectrum of light and that particular spectrum of light is incident on said object.

41. The method of claim 39 including using at least one arc lamp in said array of lamps.

42. The method of claim 39 including using at least one flash lamp in said array of lamps.

43. The method of claim 31 including determining said optical characteristic, at least approximately, at room temperature.

44. The method of claim 31 wherein the determination of the optical characteristic is performed prior to applying heat to the object.

45. The method of claim 31 wherein the determination of the optical characteristic uses a low optical power so as to produce a negligible change in said object.

46. The method of claim 31 including using a heated plate for said selectively heating the object to at least generally produce a temperature rise throughout the object.

47. The method of claim 36 including using an array of flash lamps to apply said pulse of energy.

48. The method of claim 21 wherein performing a determination of at least one optical characteristic of said object includes (i) inducing a temperature rise in said semiconductor substrate by exposing the substrate to an energy pulse characterized by a set of pulse parameters, (ii) sensing the temperature rise of the semiconductor substrate, and (iii) based on said temperature rise in combination with said set of pulse parameters, determining an absorptivity of the semiconductor substrate as said optical characteristic.

49. The method of claim 31 wherein performing a determination of at least one optical characteristic of said object, using said illumination, includes (i) inducing a temperature rise in said semiconductor substrate by exposing the substrate to an energy pulse characterized by a set of pulse parameters, (ii) sensing the temperature rise of the semiconductor substrate, and (iii) based on said temperature rise in combination with said set of pulse parameters, determining an absorptivity of the semiconductor substrate as said optical characteristic.

* * * * *